(12) United States Patent
Millward

(10) Patent No.: US 9,087,699 B2
(45) Date of Patent: Jul. 21, 2015

(54) METHODS OF FORMING AN ARRAY OF OPENINGS IN A SUBSTRATE, AND RELATED METHODS OF FORMING A SEMICONDUCTOR DEVICE STRUCTURE

(71) Applicant: Micron Technology, Inc., Boise, ID (US)

(72) Inventor: Dan B. Millward, Boise, ID (US)

(73) Assignee: Micron Technology, Inc., Boise, ID (US)

(*) Notice: Subject to any disclaimer, the term of this patent is extended or adjusted under 35 U.S.C. 154(b) by 136 days.

(21) Appl. No.: 13/646,131

(22) Filed: Oct. 5, 2012

(65) Prior Publication Data
US 2014/0097520 A1    Apr. 10, 2014

(51) Int. Cl.
| H01L 29/06 | (2006.01) |
| H01L 21/033 | (2006.01) |
| H01L 21/768 | (2006.01) |
| H01L 27/108 | (2006.01) |

(52) U.S. Cl.
CPC ...... *H01L 21/0337* (2013.01); *H01L 21/76816* (2013.01); *H01L 27/10888* (2013.01)

(58) Field of Classification Search
USPC ............ 257/622, E21.24, E21.259; 438/424, 438/780
See application file for complete search history.

(56) References Cited

U.S. PATENT DOCUMENTS

| 4,623,674 A | 11/1986 | Bailey |
| 4,797,357 A | 1/1989 | Mura et al. |
| 4,818,713 A | 4/1989 | Feygenson |
| 4,877,647 A | 10/1989 | Klabunde |
| 5,328,810 A | 7/1994 | Lowrey et al. |
| 5,374,367 A | 12/1994 | Edamura et al. |
| 5,382,373 A | 1/1995 | Carlson |
| 5,482,656 A | 1/1996 | Hiraoka et al. |
| 5,512,131 A | 4/1996 | Kumar et al. |

(Continued)

FOREIGN PATENT DOCUMENTS

| CN | 1562730 A | 1/2005 |
| CN | 1799131 A | 7/2006 |

(Continued)

OTHER PUBLICATIONS

Fujita et al., Thin Silica Film with a Network Structure as Prepared by Surface Sol-Gel Transcription on the Poly(styrene-b-4-vinylpyridine) Polymer Film, Chemistry Letters, vol. 32, No. 4, Dec. 31, 2003, pp. 352-353.

(Continued)

*Primary Examiner* — Matthew Gordon
(74) *Attorney, Agent, or Firm* — TraskBritt

(57) ABSTRACT

A method of forming an array of openings in a substrate. The method comprises forming a template structure comprising a plurality of parallel features and a plurality of additional parallel features perpendicularly intersecting the plurality of additional parallel features of the plurality over a substrate to define wells, each of the plurality of parallel features having substantially the same dimensions and relative spacing as each of the plurality of additional parallel features. A block copolymer material is formed in each of the wells. The block copolymer material is processed to form a patterned polymer material defining a pattern of openings. The pattern of openings is transferred to the substrate to form an array of openings in the substrate. A method of forming a semiconductor device structure, and a semiconductor device structure are also described.

21 Claims, 10 Drawing Sheets

(56) References Cited

U.S. PATENT DOCUMENTS

| | | |
|---|---|---|
| 5,538,655 A | 7/1996 | Fauteux et al. |
| 5,580,700 A | 12/1996 | Rahman |
| 5,620,850 A | 4/1997 | Bamdad et al. |
| 5,622,668 A | 4/1997 | Thomas et al. |
| 5,772,905 A | 6/1998 | Chou |
| 5,834,583 A | 11/1998 | Hancock et al. |
| 5,849,810 A | 12/1998 | Müller |
| 5,879,582 A | 3/1999 | Havelka et al. |
| 5,879,853 A | 3/1999 | Azuma |
| 5,891,356 A | 4/1999 | Inoue et al. |
| 5,904,824 A | 5/1999 | Oh et al. |
| 5,925,259 A | 7/1999 | Biebuyck et al. |
| 5,948,470 A | 9/1999 | Harrison et al. |
| 5,958,704 A | 9/1999 | Starzl et al. |
| 6,051,869 A | 4/2000 | Pan et al. |
| 6,111,323 A | 8/2000 | Carter et al. |
| 6,143,647 A | 11/2000 | Pan et al. |
| 6,153,495 A | 11/2000 | Kub et al. |
| 6,207,787 B1 | 3/2001 | Fahey et al. |
| 6,251,791 B1 | 6/2001 | Tsai et al. |
| 6,270,946 B1 | 8/2001 | Miller |
| 6,309,580 B1 | 10/2001 | Chou |
| 6,310,138 B1 | 10/2001 | Yonezawa et al. |
| 6,312,971 B1 | 11/2001 | Amundson et al. |
| 6,368,871 B1 | 4/2002 | Christel et al. |
| 6,403,382 B1 | 6/2002 | Zhu et al. |
| 6,414,164 B1 | 7/2002 | Afzali-Ardakani et al. |
| 6,423,465 B1 | 7/2002 | Hawker et al. |
| 6,423,474 B1 | 7/2002 | Holscher |
| 6,503,841 B1 | 1/2003 | Criscuolo et al. |
| 6,506,660 B2 | 1/2003 | Holmes et al. |
| 6,517,933 B1 | 2/2003 | Soane et al. |
| 6,518,194 B2 | 2/2003 | Winningham et al. |
| 6,537,920 B1 | 3/2003 | Krivokapic |
| 6,548,830 B1 | 4/2003 | Noguchi et al. |
| 6,565,763 B1 | 5/2003 | Asakawa et al. |
| 6,565,764 B2 | 5/2003 | Hiraoka et al. |
| 6,566,248 B1 | 5/2003 | Wang et al. |
| 6,569,528 B2 | 5/2003 | Nam et al. |
| 6,573,030 B1 | 6/2003 | Fairbairn et al. |
| 6,592,764 B1 | 7/2003 | Stucky et al. |
| 6,630,520 B1 | 10/2003 | Bruza et al. |
| 6,635,912 B2 | 10/2003 | Ohkubo |
| 6,656,308 B2 | 12/2003 | Hougham et al. |
| 6,679,996 B1 | 1/2004 | Yao |
| 6,682,660 B2 | 1/2004 | Sucholeiki et al. |
| 6,689,473 B2 | 2/2004 | Guire et al. |
| 6,699,797 B1 | 3/2004 | Morris et al. |
| 6,713,238 B1 | 3/2004 | Chou et al. |
| 6,746,825 B2 | 6/2004 | Nealey et al. |
| 6,767,693 B1 | 7/2004 | Okoroanyanwu |
| 6,780,492 B2 | 8/2004 | Hawker et al. |
| 6,781,166 B2 | 8/2004 | Lieber et al. |
| 6,797,202 B2 | 9/2004 | Endo et al. |
| 6,809,210 B2 | 10/2004 | Chandross |
| 6,812,132 B2 | 11/2004 | Ramachandrarao et al. |
| 6,825,358 B2 | 11/2004 | Afzali-Ardakani et al. |
| 6,884,842 B2 | 4/2005 | Soane et al. |
| 6,887,332 B1 | 5/2005 | Kagan et al. |
| 6,890,624 B1 | 5/2005 | Kambe et al. |
| 6,890,703 B2 | 5/2005 | Hawker et al. |
| 6,908,861 B2 | 6/2005 | Sreenivasan et al. |
| 6,911,400 B2 | 6/2005 | Colburn et al. |
| 6,913,697 B2 | 7/2005 | Lopez et al. |
| 6,924,341 B2 | 8/2005 | Mays et al. |
| 6,926,953 B2 | 8/2005 | Nealey et al. |
| 6,940,485 B2 | 9/2005 | Noolandi |
| 6,946,332 B2 | 9/2005 | Loo et al. |
| 6,949,456 B2 | 9/2005 | Kumar |
| 6,952,436 B2 | 10/2005 | Wirnsberger et al. |
| 6,957,608 B1 | 10/2005 | Hubert et al. |
| 6,962,823 B2 | 11/2005 | Empedocles et al. |
| 6,989,426 B2 | 1/2006 | Hu |
| 6,992,115 B2 | 1/2006 | Hawker et al. |
| 6,995,439 B1 | 2/2006 | Hill et al. |
| 6,998,152 B2 | 2/2006 | Uhlenbrock |
| 7,001,795 B2 | 2/2006 | Jiang et al. |
| 7,009,227 B2 | 3/2006 | Patrick et al. |
| 7,030,495 B2 | 4/2006 | Colburn et al. |
| 7,037,738 B2 | 5/2006 | Sugiyama et al. |
| 7,037,744 B2 | 5/2006 | Colburn et al. |
| 7,045,851 B2 | 5/2006 | Black et al. |
| 7,056,455 B2 | 6/2006 | Matyjaszewski et al. |
| 7,056,849 B2 | 6/2006 | Wan et al. |
| 7,060,774 B2 | 6/2006 | Sparrowe et al. |
| 7,066,801 B2 | 6/2006 | Balijepalli et al. |
| 7,077,992 B2 | 7/2006 | Sreenivasan et al. |
| 7,087,267 B2 | 8/2006 | Breen et al. |
| 7,090,784 B2 | 8/2006 | Asakawa et al. |
| 7,112,617 B2 | 9/2006 | Kim |
| 7,115,305 B2 | 10/2006 | Bronikowski et al. |
| 7,115,525 B2 | 10/2006 | Abatchev et al. |
| 7,115,995 B2 | 10/2006 | Wong |
| 7,118,784 B1 | 10/2006 | Xie |
| 7,119,321 B2 | 10/2006 | Quinlan |
| 7,132,370 B2 | 11/2006 | Paraschiv et al. |
| 7,135,144 B2 | 11/2006 | Christel et al. |
| 7,135,241 B2 | 11/2006 | Ferraris et al. |
| 7,135,388 B2 | 11/2006 | Ryu et al. |
| 7,135,523 B2 | 11/2006 | Ho et al. |
| 7,151,209 B2 | 12/2006 | Empedocles et al. |
| 7,163,712 B2 | 1/2007 | Chilkoti et al. |
| 7,166,304 B2 | 1/2007 | Harris et al. |
| 7,172,953 B2 | 2/2007 | Lieber et al. |
| 7,186,613 B2 | 3/2007 | Kirner et al. |
| 7,189,430 B2 | 3/2007 | Ajayan et al. |
| 7,189,435 B2 | 3/2007 | Tuominen et al. |
| 7,190,049 B2 | 3/2007 | Tuominen et al. |
| 7,195,733 B2 | 3/2007 | Rogers et al. |
| 7,202,308 B2 | 4/2007 | Boussand et al. |
| 7,208,836 B2 | 4/2007 | Manning |
| 7,252,791 B2 | 8/2007 | Wasserscheid et al. |
| 7,259,101 B2 | 8/2007 | Zurcher et al. |
| 7,279,396 B2 | 10/2007 | Derderian et al. |
| 7,282,240 B1 | 10/2007 | Jackman et al. |
| 7,291,284 B2 | 11/2007 | Mirkin et al. |
| 7,311,943 B2 | 12/2007 | Jacobson et al. |
| 7,326,514 B2 | 2/2008 | Dai et al. |
| 7,332,370 B2 | 2/2008 | Chang et al. |
| 7,332,627 B2 | 2/2008 | Chandross et al. |
| 7,338,275 B2 | 3/2008 | Choi et al. |
| 7,347,953 B2 | 3/2008 | Black et al. |
| 7,368,314 B2 | 5/2008 | Ufert |
| 7,407,887 B2 | 8/2008 | Guo |
| 7,408,186 B2 | 8/2008 | Merkulov et al. |
| 7,419,772 B2 | 9/2008 | Watkins et al. |
| 7,470,954 B2 | 12/2008 | Lee et al. |
| 7,514,339 B2 | 4/2009 | Yang et al. |
| 7,521,090 B1 | 4/2009 | Cheng et al. |
| 7,553,760 B2 | 6/2009 | Yang et al. |
| 7,569,855 B2 | 8/2009 | Lai |
| 7,585,741 B2 | 9/2009 | Manning |
| 7,592,247 B2 | 9/2009 | Yang et al. |
| 7,605,081 B2 | 10/2009 | Yang et al. |
| 7,632,544 B2 | 12/2009 | Ho et al. |
| 7,655,383 B2 | 2/2010 | Mela et al. |
| 7,658,773 B2 | 2/2010 | Pinnow |
| 7,700,157 B2 | 4/2010 | Bronikowski et al. |
| 7,723,009 B2 | 5/2010 | Sandhu et al. |
| 7,767,099 B2 | 8/2010 | Li et al. |
| 7,888,228 B2 | 2/2011 | Blanchard |
| 7,959,975 B2 | 6/2011 | Millward |
| 7,964,107 B2 | 6/2011 | Millward |
| 8,039,196 B2 | 10/2011 | Kim et al. |
| 8,080,615 B2 | 12/2011 | Millward |
| 8,083,953 B2 | 12/2011 | Millward et al. |
| 8,083,958 B2 | 12/2011 | Li et al. |
| 8,097,175 B2 | 1/2012 | Millward et al. |
| 8,101,261 B2 | 1/2012 | Millward et al. |
| 8,114,300 B2 | 2/2012 | Millward |
| 8,114,301 B2 | 2/2012 | Millward et al. |
| 8,114,306 B2 | 2/2012 | Cheng et al. |
| 8,206,601 B2 | 6/2012 | Bosworth et al. |
| 8,287,749 B2 | 10/2012 | Hasegawa et al. |

(56) References Cited

U.S. PATENT DOCUMENTS

| | | |
|---|---|---|
| 8,294,139 B2 | 10/2012 | Marsh et al. |
| 8,372,295 B2 | 2/2013 | Millward |
| 8,394,483 B2 | 3/2013 | Millward |
| 8,404,124 B2 | 3/2013 | Millward et al. |
| 8,409,449 B2 | 4/2013 | Millward et al. |
| 8,425,982 B2 | 4/2013 | Regner |
| 8,426,313 B2 | 4/2013 | Millward et al. |
| 8,445,592 B2 | 5/2013 | Millward |
| 2001/0024768 A1 | 9/2001 | Matsuo et al. |
| 2001/0049195 A1 | 12/2001 | Chooi et al. |
| 2002/0055239 A1 | 5/2002 | Tuominen et al. |
| 2002/0084429 A1 | 7/2002 | Craighead et al. |
| 2002/0158342 A1 | 10/2002 | Tuominen et al. |
| 2002/0167117 A1 | 11/2002 | Chou |
| 2003/0010241 A1 | 1/2003 | Fujihira et al. |
| 2003/0034329 A1 | 2/2003 | Chou |
| 2003/0068639 A1 | 4/2003 | Haneder et al. |
| 2003/0077452 A1 | 4/2003 | Guire et al. |
| 2003/0080471 A1 | 5/2003 | Chou |
| 2003/0080472 A1 | 5/2003 | Chou |
| 2003/0091752 A1 | 5/2003 | Nealey et al. |
| 2003/0100822 A1 | 5/2003 | Lew et al. |
| 2003/0108879 A1 | 6/2003 | Klaerner et al. |
| 2003/0143375 A1 | 7/2003 | Noguchi et al. |
| 2003/0157248 A1 | 8/2003 | Watkins et al. |
| 2003/0178707 A1 | 9/2003 | Abbott |
| 2003/0180522 A1 | 9/2003 | DeSimone et al. |
| 2003/0180966 A1 | 9/2003 | Abbott et al. |
| 2003/0185741 A1 | 10/2003 | Matyjaszewski |
| 2003/0222048 A1 | 12/2003 | Asakawa et al. |
| 2003/0235930 A1 | 12/2003 | Bao et al. |
| 2004/0023287 A1 | 2/2004 | Harnack et al. |
| 2004/0028875 A1 | 2/2004 | Van Rijn et al. |
| 2004/0058059 A1 | 3/2004 | Linford et al. |
| 2004/0084298 A1 | 5/2004 | Yao et al. |
| 2004/0109263 A1 | 6/2004 | Suda et al. |
| 2004/0124092 A1 | 7/2004 | Black |
| 2004/0125266 A1 | 7/2004 | Miyauchi et al. |
| 2004/0127001 A1 | 7/2004 | Colburn et al. |
| 2004/0142578 A1 | 7/2004 | Wiesner et al. |
| 2004/0159633 A1 | 8/2004 | Whitesides et al. |
| 2004/0163758 A1 | 8/2004 | Kagan et al. |
| 2004/0175628 A1 | 9/2004 | Nealey et al. |
| 2004/0192013 A1 | 9/2004 | Ryu et al. |
| 2004/0222415 A1 | 11/2004 | Chou et al. |
| 2004/0242688 A1 | 12/2004 | Chandross et al. |
| 2004/0254317 A1 | 12/2004 | Hu |
| 2004/0256615 A1 | 12/2004 | Sirringhaus et al. |
| 2004/0256662 A1 | 12/2004 | Black et al. |
| 2004/0265548 A1 | 12/2004 | Ho et al. |
| 2005/0008828 A1 | 1/2005 | Libera et al. |
| 2005/0062165 A1 | 3/2005 | Saenger et al. |
| 2005/0074706 A1 | 4/2005 | Bristol et al. |
| 2005/0079486 A1 | 4/2005 | Abbott et al. |
| 2005/0100830 A1 | 5/2005 | Xu et al. |
| 2005/0120902 A1 | 6/2005 | Adams et al. |
| 2005/0124135 A1 | 6/2005 | Ayazi et al. |
| 2005/0133697 A1 | 6/2005 | Potyrailo et al. |
| 2005/0147841 A1 | 7/2005 | Tavkhelidze |
| 2005/0167651 A1 | 8/2005 | Merkulov et al. |
| 2005/0176256 A1 | 8/2005 | Kudelka |
| 2005/0208752 A1 | 9/2005 | Colburn et al. |
| 2005/0238889 A1 | 10/2005 | Iwamoto et al. |
| 2005/0238967 A1 | 10/2005 | Rogers et al. |
| 2005/0250053 A1 | 11/2005 | Marsh et al. |
| 2005/0271805 A1 | 12/2005 | Kambe et al. |
| 2005/0272341 A1 | 12/2005 | Colburn et al. |
| 2006/0013956 A1 | 1/2006 | Angelescu et al. |
| 2006/0014001 A1 | 1/2006 | Zhang et al. |
| 2006/0024590 A1 | 2/2006 | Sandhu |
| 2006/0030495 A1 | 2/2006 | Gregg |
| 2006/0035387 A1 | 2/2006 | Wagner et al. |
| 2006/0038182 A1 | 2/2006 | Rogers et al. |
| 2006/0046079 A1 | 3/2006 | Lee et al. |
| 2006/0046480 A1 | 3/2006 | Guo |
| 2006/0060863 A1 | 3/2006 | Lu et al. |
| 2006/0062867 A1 | 3/2006 | Choi et al. |
| 2006/0078681 A1 | 4/2006 | Hieda et al. |
| 2006/0097134 A1 | 5/2006 | Rhodes |
| 2006/0105562 A1 | 5/2006 | Yi |
| 2006/0124467 A1 | 6/2006 | Ho et al. |
| 2006/0128165 A1 | 6/2006 | Theiss et al. |
| 2006/0134556 A1 | 6/2006 | Nealey et al. |
| 2006/0137554 A1 | 6/2006 | Kron et al. |
| 2006/0141222 A1 | 6/2006 | Fischer et al. |
| 2006/0141245 A1 | 6/2006 | Stellacci et al. |
| 2006/0154466 A1 | 7/2006 | Lee et al. |
| 2006/0163646 A1 | 7/2006 | Black et al. |
| 2006/0192283 A1 | 8/2006 | Benson |
| 2006/0205875 A1 | 9/2006 | Cha et al. |
| 2006/0211871 A1 | 9/2006 | Dai |
| 2006/0217285 A1 | 9/2006 | Destarac |
| 2006/0228635 A1 | 10/2006 | Suleski |
| 2006/0231525 A1 | 10/2006 | Asakawa et al. |
| 2006/0249784 A1 | 11/2006 | Black et al. |
| 2006/0249796 A1 | 11/2006 | Tavkhelidze |
| 2006/0254440 A1 | 11/2006 | Choi et al. |
| 2006/0255505 A1 | 11/2006 | Sandhu et al. |
| 2006/0257633 A1 | 11/2006 | Inoue et al. |
| 2006/0258159 A1 | 11/2006 | Colburn et al. |
| 2006/0278158 A1 | 12/2006 | Tolbert et al. |
| 2006/0281266 A1 | 12/2006 | Wells |
| 2006/0286305 A1 | 12/2006 | Thies et al. |
| 2006/0286490 A1 | 12/2006 | Sandhu et al. |
| 2006/0292777 A1 | 12/2006 | Dunbar |
| 2007/0020749 A1 | 1/2007 | Nealey et al. |
| 2007/0023247 A1 | 2/2007 | Ulicny et al. |
| 2007/0023805 A1 | 2/2007 | Wells et al. |
| 2007/0045562 A1 | 3/2007 | Parekh |
| 2007/0045642 A1 | 3/2007 | Li |
| 2007/0071881 A1 | 3/2007 | Chua et al. |
| 2007/0072403 A1 | 3/2007 | Sakata |
| 2007/0122749 A1 | 5/2007 | Fu et al. |
| 2007/0122932 A1 | 5/2007 | Kodas et al. |
| 2007/0138131 A1 | 6/2007 | Burdinski |
| 2007/0161237 A1 | 7/2007 | Lieber et al. |
| 2007/0175859 A1 | 8/2007 | Black et al. |
| 2007/0181870 A1 | 8/2007 | Libertino et al. |
| 2007/0183035 A1 | 8/2007 | Asakawa et al. |
| 2007/0194403 A1 | 8/2007 | Cannon et al. |
| 2007/0200477 A1 | 8/2007 | Tuominen et al. |
| 2007/0208159 A1 | 9/2007 | McCloskey et al. |
| 2007/0218202 A1 | 9/2007 | Ajayan et al. |
| 2007/0222995 A1 | 9/2007 | Lu |
| 2007/0224819 A1 | 9/2007 | Sandhu |
| 2007/0224823 A1 | 9/2007 | Sandhu |
| 2007/0227383 A1 | 10/2007 | Decre et al. |
| 2007/0249117 A1 | 10/2007 | Kang et al. |
| 2007/0272951 A1 | 11/2007 | Lieber et al. |
| 2007/0281220 A1 | 12/2007 | Sandhu |
| 2007/0289943 A1 | 12/2007 | Lu et al. |
| 2007/0293041 A1 | 12/2007 | Yang |
| 2008/0032238 A1 | 2/2008 | Lu et al. |
| 2008/0038923 A1 | 2/2008 | Edelstein et al. |
| 2008/0041818 A1 | 2/2008 | Kihara et al. |
| 2008/0047930 A1 | 2/2008 | Blanchet et al. |
| 2008/0064217 A1 | 3/2008 | Horii |
| 2008/0073743 A1 | 3/2008 | Alizadeh et al. |
| 2008/0083991 A1 | 4/2008 | Yang et al. |
| 2008/0085601 A1 | 4/2008 | Park et al. |
| 2008/0093743 A1 | 4/2008 | Yang et al. |
| 2008/0102252 A1 | 5/2008 | Black et al. |
| 2008/0103256 A1 | 5/2008 | Kim et al. |
| 2008/0113169 A1 | 5/2008 | Cha et al. |
| 2008/0164558 A1 | 7/2008 | Yang et al. |
| 2008/0174726 A1 | 7/2008 | Kim |
| 2008/0176767 A1 | 7/2008 | Millward |
| 2008/0193658 A1 | 8/2008 | Millward |
| 2008/0217292 A1 | 9/2008 | Millward et al. |
| 2008/0233297 A1 | 9/2008 | de Jong et al. |
| 2008/0233323 A1 | 9/2008 | Cheng et al. |
| 2008/0257187 A1 | 10/2008 | Millward |
| 2008/0260941 A1 | 10/2008 | Jin |
| 2008/0274413 A1 | 11/2008 | Millward |

(56) References Cited

U.S. PATENT DOCUMENTS

| | | |
|---|---|---|
| 2008/0286659 A1 | 11/2008 | Millward |
| 2008/0311347 A1 | 12/2008 | Millward et al. |
| 2008/0315270 A1 | 12/2008 | Marsh et al. |
| 2008/0318005 A1 | 12/2008 | Millward |
| 2009/0062470 A1 | 3/2009 | Millward et al. |
| 2009/0155579 A1 | 6/2009 | Greco et al. |
| 2009/0200646 A1 | 8/2009 | Millward et al. |
| 2009/0206489 A1 | 8/2009 | Li et al. |
| 2009/0212016 A1 | 8/2009 | Cheng et al. |
| 2009/0218567 A1 | 9/2009 | Mathew et al. |
| 2009/0236309 A1 | 9/2009 | Millward et al. |
| 2009/0240001 A1 | 9/2009 | Regner |
| 2009/0263628 A1 | 10/2009 | Millward |
| 2009/0267058 A1 | 10/2009 | Namdas et al. |
| 2009/0274887 A1 | 11/2009 | Millward et al. |
| 2009/0317540 A1 | 12/2009 | Sandhu et al. |
| 2010/0092873 A1 | 4/2010 | Sills et al. |
| 2010/0102415 A1 | 4/2010 | Millward et al. |
| 2010/0124826 A1 | 5/2010 | Millward et al. |
| 2010/0137496 A1 | 6/2010 | Millward et al. |
| 2010/0163180 A1 | 7/2010 | Millward |
| 2010/0204402 A1 | 8/2010 | Millward et al. |
| 2010/0279062 A1 | 11/2010 | Millward et al. |
| 2010/0316849 A1 | 12/2010 | Millward et al. |
| 2010/0323096 A1 | 12/2010 | Sills et al. |
| 2011/0232515 A1 | 9/2011 | Millward |
| 2012/0028471 A1 | 2/2012 | Oyama et al. |
| 2012/0122292 A1 | 5/2012 | Sandhu et al. |
| 2012/0133017 A1 | 5/2012 | Millward et al. |
| 2012/0135159 A1 | 5/2012 | Xiao et al. |
| 2012/0138570 A1 | 6/2012 | Millward et al. |
| 2012/0164389 A1 | 6/2012 | Yang et al. |
| 2012/0202017 A1 | 8/2012 | Nealey et al. |
| 2012/0211871 A1 | 8/2012 | Russell et al. |
| 2012/0223053 A1 | 9/2012 | Millward et al. |
| 2012/0225243 A1 | 9/2012 | Millward |
| 2013/0295323 A1 | 11/2013 | Millward |
| 2013/0330668 A1 | 12/2013 | Wu et al. |
| 2013/0330688 A1 | 12/2013 | Hedrick et al. |
| 2014/0060736 A1 | 3/2014 | Millward et al. |

FOREIGN PATENT DOCUMENTS

| | | |
|---|---|---|
| CN | 101013662 A | 8/2007 |
| EP | 0784543 | 4/2000 |
| EP | 1416303 A2 | 5/2004 |
| EP | 1906237 A2 | 4/2008 |
| EP | 1593164 B1 | 6/2010 |
| JP | 11080414 A | 3/1999 |
| JP | 2003155365 | 5/2003 |
| JP | 2004335962 | 11/2004 |
| JP | 2005008882 A | 1/2005 |
| JP | 2005029779 A | 2/2005 |
| JP | 2006036923 A | 2/2006 |
| JP | 2006055982 A | 3/2006 |
| JP | 2006110434 A | 4/2006 |
| JP | 2007194175 | 8/2007 |
| JP | 2008036491 A | 2/2008 |
| KR | 1020060128378 A | 12/2006 |
| KR | 20070029762 | 3/2007 |
| KR | 100771886 B1 | 11/2007 |
| TW | 200400990 | 3/1992 |
| TW | 200633925 | 10/1994 |
| TW | 200740602 | 1/1996 |
| TW | 584670 B | 4/2004 |
| TW | 200419017 | 10/2004 |
| TW | 200511364 | 3/2005 |
| TW | 256110 | 6/2006 |
| TW | I253456 | 11/2007 |
| TW | 200802421 | 1/2008 |
| WO | 9007575 | 7/1990 |
| WO | 9706013 A1 | 2/1997 |
| WO | 9839645 A1 | 9/1998 |
| WO | 9947570 A1 | 9/1999 |
| WO | 0031183 A1 | 6/2000 |
| WO | 0218080 A1 | 3/2002 |
| WO | 02081372 A2 | 10/2002 |
| WO | 03045840 A2 | 6/2003 |
| WO | 2005122285 A2 | 12/2005 |
| WO | 2006003592 A2 | 1/2006 |
| WO | 2006003594 A2 | 1/2006 |
| WO | 2006076016 A2 | 7/2006 |
| WO | 2006078952 A1 | 7/2006 |
| WO | 2006112887 A2 | 10/2006 |
| WO | 2007001294 A1 | 1/2007 |
| WO | 2007013889 A2 | 2/2007 |
| WO | 2007024241 A2 | 3/2007 |
| WO | 2007024323 A2 | 3/2007 |
| WO | 2007019439 A3 | 5/2007 |
| WO | 2007055041 A1 | 5/2007 |
| WO | 2008055137 A2 | 5/2008 |
| WO | 2008091741 A2 | 7/2008 |
| WO | 2008096335 A2 | 8/2008 |
| WO | 2008097736 A2 | 8/2008 |
| WO | 2008118635 A2 | 10/2008 |
| WO | 2008124219 A2 | 10/2008 |
| WO | 2008130847 A1 | 10/2008 |
| WO | 2008145268 A1 | 12/2008 |
| WO | 2008156977 A2 | 12/2008 |
| WO | 2009099924 A2 | 8/2009 |
| WO | 2009102551 A2 | 8/2009 |
| WO | 2009117238 A2 | 9/2009 |
| WO | 2009117243 A1 | 9/2009 |
| WO | 2009134635 A2 | 11/2009 |

OTHER PUBLICATIONS

Melde et al., Silica Nanostructures Templated by Oriented Block Copolymer Thin Films Using Pore-Filling and Selective-Mineralization Routes, Chem. Mater., vol. 17, No. 18, Aug. 13, 2005, pp. 4743-4749.

La, Young-Hye, et al., "Directed Assembly of Cylinder-Forming Block Copolymers into Patterned Structures to Fabricate Arrays of Spherical Domains and Nanoparticles," Chem. Mater, 2007, vol. 19, No. 18, Department of Chemical and Biological Engineering and Center for Nanotechnology, Univ. of Wisconsin, pp. 4538-4544.

La, Young-Hye, et al., "Pixelated Chemically Amplified Resists: Investigation of Material Structure on the Spatial Distribution of Photoacids and Line Edge Roughness," J. Vac. Sci. Technol. B 25(6), Nov./Dec. 2007, American Vacuum Society, pp. 2508-2513.

Laracuente, A.R., et al., "Step Structure and Surface Morphology of Hydrogen-terminated Silicon: (001) to (114)," Surface Science 545, 2003, pp. 70-84.

Lentz, D, et al., "Whole Wafer Imprint Patterning Using Step and Flash Imprint Lithography: A Manufacturing Solution for Sub 100 nm Patterning", SPIE Advanced Lithography Paper, http://molecularimprints.com/NewsEvents/tech_articles/new_articles/SPIE_07_MII_WW_Paper.pdf), Molecular Imprints, Inc., Texas, USA, Feb. 2007, pp. 1-10.

Li, Mingqi, et al., "Block Copolymer Patterns and Templates," Materials Today, vol. 9, No. 9, Sep. 2006, pp. 30-39.

Li, Wai-Kin, et al, "Creation of Sub-20-nm Contact Using Diblock Copolymer on a 300 mm Wafer for Complementary Metal Oxide Semiconductor Applications," J. Vac. Sci. Technol. B 25(6), Nov./Dec. 2007, American Vacuum Society, pp. 1982-1984.

Li, Xue, et al., "Morphology Change of Asymmetric Diblock Copolymer Micellar Films During Solvent Annealing," ScienceDirect, Polymer 48 (2007), pp. 2434-2443.

Li, Yong, et al., "A Method for Patterning Multiple Types of Cells by Using Electrochemical Desorption of Self-Assembled Monolayers within Microfluidic Channels," Angew. Chem. Int. Ed., vol. 46, pp. 1094-1096, 2007.

Lin, Zhiqun, et al., "A Rapid Route to Arrays of Nanostructures in Thin Films," Adv. Mater. 2002, 14 No. 19, Oct. 2, pp. 1373-1376.

Lin-Gibson, Sheng, et al., "Structure-Property Relationships of Photopolymerizable Poly(ethylene glycol)Dimethacrylate Hydrogels," Macromolecules 2005, 38, American Chemical Society, pp. 2897-2902.

(56) References Cited

OTHER PUBLICATIONS

Liu et al., Pattern Transfer Using Poly(styrene-block-methyl methacrylate) Copolymer Films and Reactive Ion Etching, J. Vac. Sci. Technol. B vol. 25, No. 6, Nov./Dec. 2007, pp. 1963-1968.
Loo et al., "Additive, nanoscale patterning of metal films with a stamp and a surface chemistry mediated transfer process: Applications in plastic electronics," Applied Physics Letters, vol. 81, No. 3, Jul. 15, 2002, pp. 562-564.
Lopes et al., Hierarchical Self-Assembly of Metal Nanostructures on Diblock Copolymer Scaffolds, Nature, vol. 414, Dec. 13, 2001, pp. 735-738.
Lutolf, M., et al., "Cell-Responsive Synthetic Hydrogels," Adv. Mater., vol. 15, No. 11, Jun. 2003, pp. 888-892.
Lutolf, M.P., et al, "Synthetic Biomaterials as Instructive Extracellular Microenvironments for Morphogenesis in Tissue Engineering," Nature Biotechnology, 23, 47-55 (2005), Abstract only.
Lutz, Jean-Francois, "1,3-Dipolar Cycloadditions of Azides and Alkynes: A Universal Ligation Tool in Polymer and Materials Science," Angew. Chem. Int. Ed., vol. 46, pp. 1018-1025, 2007.
Malenfant et al., Self-Assembly of an Organic-Inorganic Block Copolymer for Nano-Ordered Ceramics, Nature Nanotechnology, vol. 2, pp. 43-46 (2007).
Malkoch, M., et al., "Synthesis of Well-defined Hydrogel Networks Using Click Chemistry," Chem. Commun., 2006, The Royal Society of Chemistry, pp. 2774-2776.
Mansky, P., et al., "Controlling Polymer-Surface Interactions with Random Copolymer Brushes," Science, vol. 275, Mar. 7, 1997, pp. 1458-1460.
Martens, P., et al., "Characterization of Hydrogels Formed from Acrylate Modified Poly(vinyl alcohol) Macromers," Polymer, vol. 41, Issue 21, Oct. 2000, pp. 7715-7722, Abstract only.
Matsuda, T., et al., "Photoinduced Prevention of Tissue Adhesion," ASAIO J, Jul.-Sep. 1992; 38(3): M154-7, Abstract only.
Maye, M. A., et al., "Chemical Analysis Using Force Microscopy," Journal of Chemical Education, vol. 79, No. 2, Feb. 2002, Dept. of Chemistry, State Univ. of New York at Binghamton, USA, pp. 207-210.
Metters, A., et al., "Network Formation and Degradation Behavior of Hydrogels Formed by Michael-Type Addition Reactions," Biomacromolecules 2005, 6, 2005, pp. 290-301.
Meyer, E., et al., "Controlled Dewetting Processes on Microstructured Surfaces—a New Procedure for Thin Film Microstructuring," Macromollecular Mater. Eng., 276/277, 2000, Institute of Polymer Research Dresden, pp. 44-50.
Mezzenga, R., et al., "On the Role of Block Copolymers in Self-Assembly of Dense Colloidal Polymeric Systems," Langmuir 2003, vol. 19, No. 20, 2003, American Chemical Society, pp. 8144-8147.
Mindel, J., et.al., "A Study of Bredig Platinum Sols", The Chemical Laboratories of New York University, received Jun. 10, 1943, vol. 65 pp. 2112.
Naito, K., et al., "2.5-Inch Disk Patterned Media Prepared by an Artificially Assisted Self-Assembling Method," IEEE Transactions on Magnetics, vol. 38, No. 5, Sep. 2002, pp. 1949-1951.
Nealey, P. F., et al., "Self-Assembling Resists for Nanolithography", IProceedings of the IEEE International Electron Devices Meeting, IEDM Technical Digest, 356-359 (2005).
Nguyen, K. T., et al., "Photopolymerizable Hydrogels for Tissue Engineering Applications," Biomaterials 23, 2002, pp. 4307-4314.
Nishikubo, T., "Chemical Modification of Polymers via a Phase-Transfer Catalyst or Organic Strong Base," American Chemical Society Symposium Series, 1997, American Chemical Society, pp. 214-230.
Niu, Sanjun, et al., "Stability of Order in Solvent-Annealed Block Copolymer Thin Films," Macromolecules, vol. 36, No. 7, 2003, Univ. of Nebraska, USA, pp. 2428-2440, (web release date: Mar. 13, 2003) (http://digitalcommons.uni.edu/cgi/viewcontent.cgi?article+1005 &contect=chemeng_nanotechnology).
Niu, Sanjun, et al., "Selective assembly of nanoparticles on block copolymer by surface modification," Nanotechnology, vol. 18, pp. 1-4, 2007.
Olayo-Valles, R., et al., "Large Area Nanolithographic Templates by Selective Etching of Chemically Stained Block Copolymer Thin Films," J. Mater. Chem, 2004, 14, The Royal Society of Chemistry, pp. 2729-2731.
Parejo, P. G., et al., "Highly Efficient UV-absorbing Thin-film Coatings for Protection of Organic Materials Against Photodegradation," J. Mater. Chem, 2006, 16, The Royal Society of Chemistry, pp. 2165-2169.
Park et al., Fabrication of Highly Ordered Silicon Oxide Dots and Stripes from Block Copolymer Thin Films, Advanced Materials, vol. 20, pp. 681-685, 2008.
Park et al., High-Aspect-Ratio Cylindrical Nanopore Arrays and Their Use for Templating Titania Nanoposts, Advanced Materials, vol. 20, pp. 738-742, 2008.
Park, Cheolmin, et al., "Enabling Nanotechnology with Self Assembled Block Copolymer Patterns," Polymer 44, 2003, pp. 6725-6760.
Park, Dae-Ho, "The Fabrication of Thin Films with Nanopores and Nanogrooves from Block Copolymer Thin Films on the Neutral Surface of Self-assembled Monolayers," Nanotechnology 18, 2007, 355304, IIOP Publishing LTD, UK, pp. 1-7.
Park, M., et al., "Block Copolymer Lithography: Periodic Arrays of 1011 Holes in 1 Square Centimeter," Science, vol. 276, No. 5317, May 30, 1997, pp. 1401-1404.
Park, Sang-Min, et al., "Directed assembly of lamellae-forming block copolymers using chemically and topographically patterned substrates," Advanced Materials, vol. 19, No. 4, pp. 607-611, Feb. 2007.
Park, Seung Hak, et al., "Block Copolymer Multiple Patterning Integrated with Conventional ArF Lithography," Soft Matter, 2010, 6, Royal Society of chemistry, pp. 120-125.
Park, Sung Chan, et al., "Controlled Ordering of Block Copolymer Thin Films by the Addition of Hydrophilic Nanoparticles," Macromolecules 2007, vol. 40, No. 22, American Chemical Society, pp. 8119-8124.
Peng, J., et. al., "Development of Nanodomain and Fractal Morphologies in Solvent Annealed Block copolymer Thin Films," Macromol. Rapid Commun. 2007, 28, pp. 1422-1428.
Peters, R. D., et al., "Combining Advanced Lithographic Techniques and Self-assembly of Thin Films of Diblock Copolymers to Produce Templates for Nanofabrication," J. Vac. Sci. Technol. B, vol. 18, No. 6, Nov./Dec. 2000, American Vacuum Society, pp. 3530-3532.
Peters, R. D., et al., "Morphology of Thin Films of Diblock Copolymers on Surfaces Micropatterned with Regions of Different Interfacial Energy," Macromolecules, vol. 35, No. 5, 2002, American Chemical Society, pp. 1822-1834.
Potemkin, Igor I., et al., "Effect of the Molecular Weight of AB Diblock Copolymers on the Lamellar Orientation in Thin Films: Theory and Experiment," Macromol. Rapid Commun., 2007, 28, pp. 579-584.
Reed, M.A., et al., "Molecular random access memory cell," Appl. Phys. Lett., vol. 78, No. 23, pp. 3735-3737, Jun. 2001.
Resnick, D. J., et al., "Initial Study of the Fabrication of Step and Flash Imprint Lithography Templates for the Printing of Contact Holes," Microlith., Microfab., Microsyst., vol. 3, No. 2, Apr. 2004, Society of Photo-Optical Instrumentation Engineers, pp. 316-321.
Rogers, J. A., "Slice and Dice, Peel and Stick: Emerging Methods for Nanostructure Fabrication," ACS Nano, vol. 1, No. 3, 2007, pp. 151-153.
Rozkiewicz, Dorota I., et al., "'Click' Chemistry by Microcontact Printing," Angew. Chem. Int. Ed., vol. 45, pp. 5292-5296, 2006.
Electronegativity—<http://www.princeton.edu/~achaney/tmve/wiki100k/docs/Electronegativity.html> website, visited Aug. 28, 2013, 1 page.
Zhou et al., Nanoscale Metal/Self-Assembled Monolayer/Metal Heterostructures, American Institute of Physics, pp. 611-613 (1997).
Zhu, X. Y., et al., "Molecular Assemblies on Silicon Surfaces via Si—O Linkages," Langmuir, vol. 16, 2000, American Chemical Society, pp. 6766-6772.
Zhu, X.Y., et al., "Grafting of High-Density Poly(Ethylene Glycol) Monolayers on Si(111)," Langmuir, vol. 17, pp. 7798-7803, 2001.
Chang et al., Experimental Demonstration of Aperiodic Patterns of Directed Self-Assembly by Block Copolymer Lithography for Ran-

(56) References Cited

OTHER PUBLICATIONS dom Logic Circuit Layout, Electron Devices Meeting (IEDM), 2010 IEEE International, Dec. 6-8, 2010, pp. 33.2.1-33.2.4.

Tang et al., Evolution of Block Copolymer Lithography to Highly Ordered Square Arrays, Science, vol. 322, No. 5900, Sep. 25, 2008, pp. 429-432.

Tseng et al., Enhanced Block Copolymer Lithography Using Sequential Infiltration Synthesis, The Journal of Physical Chemistry, vol. 115, No. 36, Sep. 15, 2011, 15 pages.

Ali, H. A., et al., Properties of Self-assembled ZnO Nanostructures, Solid-State Electronics 46 (2002), 1639-1642.

Arshady, R., et al., "The Introduction of Chloromethyl Groups into Styrene-based Polymers, 1," Makromol. Chem., vol. 177, 1976, p. 2911-2918.

Asakawa et al., Fabrication of Subwavelength Structure for Improvement in Light-Extraction Efficiency of Light-Emitting Devices Using a Self-Assembled Pattern of Block Copolymer, http://www.research.ibm.com/journal/rd/515/black.html, IBM Journal of Research and Development, vol. 51, No. 5, 2007.

Bae, Joonwon, "Surface Modification Using Photo-Crosslinkable Random Copolymers", Abstract submitted for the Mar. 2006 meeting of The American Physical Society, submitted Nov. 30, 2005. (Accessed via the Internet [retrieved on Apr. 5, 2000], URL: http://absimage.aps.org/image/MWS_MAR06-2005-003641.pdf).

Balsara, C., et al, CPIMA, IRG Technical Programs, Synthesis and application of Nanostructured Materials, Leland Stanford Junior Univ., 2006, http://www.stanford.edu/group/cpima/irg/irg_1.htm, printed Jul. 1, 2009.

Bang, J., "The Effect of Humidity on the Ordering of Tri-block Copolymer Thin Films," Abstract submitted for the Mar. 2007 meeting of The American Physical Society, submitted Nov. 20, 2006.

Bass, R. B., et al., "Microcontact Printing with Octadecanethiol", Applied Surface Science, 226(4), pp. 335-340, Apr. 2004, http://www.ece.virginia.edu/UVML/sis/Papers/rbbpapers/assoct.pdf.

Bearinger, J. P., et al., "Chemisorbed Poly(propylene sulphide)-based Copolymers Resist Biomolecular Interactions," Nature Materials 2, 259-264, 2003, (published online Mar. 23, 2003). Published online Mar. 23, 2003.

Berry, B. C., et al., "Orientational Order in Block Copolymer Films Zone Annealed Below the Order-Disorder Transition Temperature," Nano Letters vol. 7, No. 9 Aug. 2007, Polymers Division, Nat'l. Inst. of Standards and Technology, Maryland, USA, pp. 2789-2794, (published on Web Aug. 11, 2007).

Berry, B. C., et al., "Effects of Zone Annealing on Thin Films of Block Copolymers", National Institute of Standard and Technology, Polymers Division, Maryland, USA, 2007, 2 pages.

Black et al., Integration of Self-Assembled Diblock Copolymers for Semiconductor Capacitor Fabrication, Applied Physics Letters, vol. 79, No. 3, pp. 409-411 (2001).

Black et al., Polymer Self Assembly in Semiconductor Microelectronics, IBM J. Res. & Dev. vol. 51, No. 5, Sep. 2007, pp. 605-633.

Black, C .T. et al., "Integration of Self Assembly for Semiconductor Microelectronics," IEEE 2005 Custom Integrated Circuits Conference, IBM T.J. Watson Research Center, pp. 87-91.

Black, C. T., "Self-aligned self-assembly of multi-nanowire silicon field effect transistors," Appl. Phys. Lett, vol. 87, pp. 163116-1 through 163116-3, 2005.

Black, C. T., "Polymer Self-Assembly as a Novel Extension to Optical Lithography," ACSNano, vol. 1, No. 3, 2007, American Chemical Society, pp. 147-150.

Black, C. T., et al., "High-Capacity, Self-Assembled Metal-Oxide-Semiconductor Decoupling Capacitors," IEEE Electron Device Letters, vol. 25, No. 9, Sep. 2004, pp. 622-624.

Black, C. T., et al., "Nanometer-Scale Pattern Registration and Alignment by Directed Diblock Copolymer Self-Assembly," IEEE Transactions on Nanotechnology, vol. 3, No. 3, pp. 412-415, Sep. 2004.

Black, C. T., et al., "Self Assembly in Semiconductor Microelectronics: Self-Aligned Sub-Lithographic Patterning Using Diblock Copolymer Thin Films," Proc. of SPIE, vol. 6153, 615302 (2006).

Black, C. T., et al., Polymer Self Assembly in Semiconductor Microelectronics, IBM J. Res. & Dev. vol. 51, No. 5, Sep. 2007, pp. 605-633.

Botelho Do Rego, A. M, et al., "Diblock Copolymer Ultrathin Films Studied by High Resolution Electron Energy Loss Spectroscopy," Surface Science, 482-485 (2001), pp. 1228-1234.

Brydson, R. M., et al. (chapter authors), "Generic Methodologies for Nanotechnology: Classification and Fabrication", Nanoscale Science and Technology, edited by R.W. Kelsall, et al., 2005 John Wiley & Sons, Ltd., (published online: Dec. 20, 2005) (http://www3.interscience.wiley.com/cgi-bin/summary/112217550/SUMMARY).

Bulpitt, P., et al, "New Strategy for Chemical Modification of Hyaluronic Acid: Preparation of Functionalized Derivatives and Their Use in the Formation of Novel Biocompatible Hydrogels," Journal of Biomedical Materials Research, vol. 47, Issue 2, pp. 152-169, Published online Aug. 13, 1999, Abstract only.

Canaria, C. A., et al., "Formation and Removal of Alkylthiolate Self-Assembled Monolayers on Gold in Aqueous Solutions", Lab Chip 6, 289-295 (2006), http://www.rsc.org/publishing/journals/LC/article.asp?doi=b51066c) (Abstract).

Candau, F., et al., "Synthesis and Characterization of Polystyrene-poly(ethylene oxide) Graft Copolymers," Polymer, 1977, vol. 18, pp. 1253-1257.

Cavicchi, K. A., et al., "Solvent Annealed Thin Films of Asymmetric Polyisoprene-Polylactide Diblock Copolymers," Macromolecules 2007, vol. 40, 2007, Univ. of Massachusetts, pp. 1181-1186.

Cha, J. N., et al., Biomimetic Approaches for Fabricating High-Density Nanopatterned Arrays, Chem. Mater. vol. 19, 2007, pp. 839-843.

Chai et al., Assembly of Aligned Linear Metallic Patterns on Silicon, Nature Nanotechnology, Vol, 2, Aug. 2007, pp. 500-506.

Chai et al., Using Cylindrical Domains of Block Copolymers to Self-Assemble and Align Metallic Nanowires, American Chemical Society, www.Acsnano.org, 2008. pp. A-K.

Chandekar, A., et al., "Template-Directed Adsorption of block Copolymers on Alkanethiol-Patterned Gold Surfaces," (circa 2006), http://www.nano.neu.edu/industry/industry_showcase/industry_day/documents/Chandekar.pdf) (Powerpoint template for scientific posters (Swarthmore College)).

Chang, Li-Wen, "Diblock Copolymer Directed Self-Assembly for CMOS Device Fabrication," Proc. of SPIE, vol. 6156, 2006, 615611-1 to 615611-6.

Chen et al., Highly Ordered Arrays of Mesoporous Silica Nanorods with Tunable Aspect Ratios from Block Copolymer Thin Films, Advanced Materials, vol. 20, pp. 763-767, 2008.

Cheng, J. Y., et al., "Rapid Directed Self Assembly of Lamellar Microdomains from a Block Copolymer Containing Hybrid," Applied Physics Letters, 91, 143106-143106-3 (2007).

Cheng, J. Y., et al., "Self-Assembled One-Dimensional Nanostructure Arrays," Nano Letters, vol. 6, No. 9, 2006, pp. 2099-2103.

Cheng, J.Y., et al., "Templated Self-Assembly of Block Copolymers: Effect of Substrate Topography," Adv. Mater. 2003, vol. 15, No. 19, pp. 1599-1602.

Cho et al., Nanoporous Block Copolymer Micelle/Micelle Multilayer Films with Dual Optical Properties, J. Am. Chem. Soc., vol. 128, No. 30, pp. 9935-9942 (2006).

Choi, H. J., et al., "Magnetorheology of Synthesized Core-Shell Structured Nanoparticle," IEEE Transactions on Magnetics, vol. 41, No. 10, Oct. 2005, pp. 3448-3450.

Clark et al., "Selective Deposition in Multilayer Assembly: SAMs as Molecular Templates," Supramolecular Science, vol. 4, pp. 141-146, (1997).

Daoulas Kostas CH., et al., "Fabrication of Complex Three-Dimensional Nanostructures from Self-Assembling Block Copolymer Materials on Two-Dimensional Chemically Patterned Templates with Mismatched Symmetry," Physical Review Letters 96, week ending Jan. 27, 2006, pp. 036104-1-036104-3.

Darling, S. B., "Directing the Self-assembly of Block Copolymers," Progress in Polymer Science, vol. 32, No. 10, Sep. 28, 2007, pp. 1152-1204.

(56) References Cited

OTHER PUBLICATIONS

Desai, Dr. Trejal A., et al., "Engineered Silicon Surfaces for Biomimetic Interfaces," Business Briefing: Medical Device Manufacturing & Technology, 2002.
Edwards, E. W., et al., "Mechanism and Kinetics of Ordering in Diblock Copolymer Thin Films on Chemically Nanopatterned Substrates," Journal of Polymer Science: Part B Polymer Physics, vol. 43, 3444-3459, 2005.
Edwards, E. W., et al., "Precise Control over Molecular Dimensions of Block-Copolymer Domains Using the Interfacial Energy of Chemically Nanopatterned Substrates," Advanced Mater., 16, No. 15, Aug. 4, 2004, pp. 1315-1319.
Elisseeff, J., et al., "Photoencapsulation of Chondrocytes in Poly(ethylene oxide)-based Semi-interpenetrating Networks," Journal of Biomedical Materials Research, 51(2): 164-171, Aug. 2000, Abstract only.
Erlandsson, Mikael, et al., "Metallic Zinc Reduction of Disulfide Bonds between Cysteine Residues in Peptides and Proteins," International Journal of Peptide Research and Therapeutics, vol. 11, No. 4, pp. 261-265, Dec. 2005.
Fasolka et al., Block Copolymer Thin Films: Physics and Applications, Annual Review, vol. 31, pp. 323-355 (2001).
Fasolka, M. J. et al., "Morphology of Ultrathin Supported Diblock Copolymer Films: Theory and Experiment," Macromolecules 2000, vol. 33, No. 15, pp. 5702-5712.
Fukunaga, K., et al., "Self-Assembly of Block Copolymer Thin Films Having a Half-Domain-Spacing Thickness: Nonequilibrium Pathways to Achieve Equilibrium Brush Layers Parallel to Substrate," Macromolecules vol. 39, Aug. 2006, pp. 6171-6179.
Gates, "Nanofabrication with Molds and Stamps," Materials Today, pp. 44-49, (Feb. 2005).
Gates, B. D., et al., "Unconventional Nanofabrication," Annu. Rev. Mater. Res. 2004, 34:339-72.
Ge, Zhenbin, et al., "Thermal Conductance of Hydrophilic and Hydrophobic Interfaces," PRL 96, 186101-1-186101-4, The American Physical Society, week ending May 12, 2006.
Gelest Inc., "Silane Coupling Agents: Connecting Across Boundaries," v2.0, 2006, pp. 1-56.
Genua, A., et al., "Functional Patterns Obtained by Nanoimprinting Lithography and Subsequent Growth of Polymer Brushes," Nanotechnology, 18, (2007), IOP Publishing Ltd., pp. 1-7.
Gillmor, S. D., et al., "Hydrophilic/Hydrophobic Patterned Surfaces as Templates for DNA Arrays," Langmuir 2000, vol. 16, No. 18, 2000, pp. 7223-7228.
Grubbs, Hybrid Metal-Polymer Composites from Functional Block Copolymers, Journal of Polymer Science: Part A: Polymer Chemistry, vol. 43, pp. 4323-4336 (2005).
Guarini et al., Nanoscale Patterning Using Self-Assembled Polymers for Semiconductor Applications, J. Vac. Sci. Technol. B 19(6), pp. 2784-2788, Nov./Dec. (2001).
Gudipati, C. S., et al., "Hyperbranched Fluoropolymer and Linear Poly(ethylene glycol) Based Amphiphilic Crosslinked Networks as Efficient Antifouling Coatings: An Insight into the Surface Compositions, Topographies, and Morphologies," Journal of Polymer Science Part A: Polymer Chemistry, vol. 42, (2004), pp. 6193-6208.
Guo, Kai, et al., Abstract of "Synthesis and Characterization of Novel Biodegradable Unsaturated Poly(ester amide)/Poly(ethylene glycol) Diacrylate Hydrogels", Journal of Polymer Science Part A: Polymer Chemistry, vol. 43, Issue 17, 2005 Wiley Periodicals, Inc., pp. 3932-3944.
Hadziioannou, Semiconductor Block Copolymers for Self-Assembled Photovoltaic Devices, MRS Bulletin, pp. 456-460 (2002).
Hamers, Robert J., "Passivation and activation: How do monovalent atoms modify the reactivity of silicon surfaces? A perspective on the article, 'The mechanism of amine formation on Si(100) activated with chlorine atoms,'" Surface Science, vol. 600, pp. 3361-3362, 2006.
Hamley, I. W., "Introduction to Block Copolymers", Developments in Block Copolymers Science and Technology, John Wiley & Sons, Ltd., 2004, pp. 1-29.
Hammond, M. R., et al., "Temperature Dependence of Order, Disorder, and Defects in Laterally Confined Diblock Copolymer Cylinder Monolayers," Macromolecules, vol. 38, Jul. 2005; American Chemical Society, p. 6575-6585.
Harrison, C., et al., "Layer by Layer Imaging of Diblock Copolymer Films with a Scanning Electron Microscope," Polymer, vol. 39, No. 13, 1998, pp. 2733-2744.
Hawker, C. J., et al., "Facile Synthesis of Block Copolymers for Nanolithographic Applications," Polymer Reprints, American Chemical Society (2005).
Hawker, C. J., et al., Abstract for "Improving the Manufacturability and Structural Control of Block Copolymer Lithography," Abstracts of Papers, 232nd ACS National Meeting, San Francisco, CA, Sep. 10-14, 2006.
Hayward et al., Crosslinked Poly(styrene)-block-Poly(2-vinylpyridine) Thin Films as Swellable Templates for Mesostructured Silica and Titania, Advanced Materials, vol. 17, 2005, pp. 2591-2595.
He et al., "Self-Assembly of Block Copolymer Micelles in an Ionic Liquid," J. Am. Chem. Soc. 2006, 128, pp. 2745-2750.
Helmbold, A., et al., "Optical Absorption of Amorphous Hydrogenated Carbon Thin Films," Thin Solid Films 283 (1996) pp. 196-203.
Helmuth, Jo A., et al., "High-Speed Microcontact Printing," J. Am. Chem. Soc., vol. 128, No. 29, pp. 9296-9297, 2006.
Hermans, T. M., et al., "Application of Solvent-Directed Assembly of Block Copolymers to the Synthesis of Nanostructured Materials with Low Dielectric Constants", Angewandte Chem. Int. Ed., vol. 45, Issue 40, Oct. 13, 2006, pp. 6648-6652.
Horiuchi et al., Three-Dimensional Nanoscale Alignment of Metal Nanoparticles Using Block Copolymer Films as Nanoreactors, Langmuir, vol. 19, pp. 2963-2973 (2003).
Huang et al., "Stretchable gold conductors on elastomeric substrates," Applied Physics Letters, vol. 82, No. 15, p. 2404.
Huang et al., "Using Surface Active Random Copolymers to Control the Domain Orientation in Diblock Copolymer Thin Films," Macromolecules, 1998, 31, 7641-7650.
Hur et al., "Nanotransfer printing by use of noncovalent surface forces: Applications to thin-film transistors that use single-walled carbon nanotube networks and semiconducting polymers," Applied Physics Letters, vol. 85, No. 23, Dec. 6, 2004, pp. 5730-5732.
Hutchison, J. B, et al., "Polymerizable Living Free Radical Initiators as a Platform to Synthesize Functional Networks," Chem. Mater., vol. 17, No. 19, 2005, pp. 4789-4797.
Ikeda, Susumu, et al., "Control of Orientation of Thin Films of Organic Semiconductors by Graphoepitaxy," NanotechJapan Bulletin—vol. 3, No. 3, Dec. 17, 2010/Focus 26-06, NIMS International Center for Nanotechnology Network.
In, Insik, et al., "Side-Chain-Grafted Random Copolymer Brushes as Neutral Surfaces for Controlling the Orientation of Block Copolymer Microdomains in Thin Films," Langmuir, vol. 22, No. 18, 2006, Department of Materials Science and Engineering and Chemical and Biological Engineering, Univ. of Wisconsin-Madison, pp. 7855-7860.
Ji, Shengxiang, et al., "Generalization of the Use of Random Copolymers to Control the Wetting Behaviors of Block Copolymer Films," Macromolecules, 2008, 41(23): 9098-9103.
Ji, Shengxiang, et al., "Molecular Transfer Printing Using Block Copolymers," ACS Nano, vol. 4, No. 2, 2010, Dept. of Chemical and Biological Engineering, Univ. of Wisconsin, pp. 599-609.
Ji, Shengxiang, et al., "Preparation of Neutral Wetting Brushes for Block Copolymer Films from Homopolymer Blends," submitted to Advanced Materials, 20(16): 3054-3060; published online Jul. 7, 2008.
Jiang, Xingyu, et al., "Electrochemical Desorption of Self-Assembled Monolayers Noninvasively Releases Patterned Cells from Geometrical Confinements," J. Am. Chem. Soc., vol. 125, No. 9, pp. 2366-2367, 2003.
Johnson, Daniel L., et al., "Probing the stability of the disulfide radical intermediate of thioredoxin using direct electrochemistry," Letters in Peptide Science, vol. 10, pp. 495-500, 2003.
Jun, Y., et al., "Microcontact Printing Directly on the Silicon Surface," Langmuir, 2002, 18(9), pp. 3415-3417, Abstract only.

(56) References Cited

OTHER PUBLICATIONS

Jun, Yongseok, et al., "Microcontact Printing Directly on the Silicon Surface," Langmuir, vol. 18, No. 9, pp. 3415-3417, 2002.
Jun, Yongseok, et al., "Patterning protein molecules on poly(ethylene glycol) coated Si(111)," Biomaterials, vol. 25, pp. 3503-3509, 2004.
Karim, Alamgir, et al., "Control of Ordering Kinetics and Morphology Using Zone Annealing of Thin Block Copolymer Films", Abstract submitted for the Mar. 2007 Meeting of the American Physical Society, Nov. 20, 2006.
Kavakli et al., Single and Double-Layer Antireflection Coatings on Silicon, Turk J Phys, vol. 26, pp. 349-354 (2002).
Kim, Is, et al., "Self-assembled Hydrogel Nanoparticles Composed of Dextran and Poly (ethylene glycol) Macromer," Int J Pharm., Sep. 15, 2000; 205(1-2): 109-116, Abstract only.
Kim, Sang Ouk, et al., "Epitaxial Self-assembly of Block Copolymers on Lithographically Defined Nanopatterned Substrates," Nature, vol. 424, Jul. 24, 2003, Dept. of Chemical Engineering and Center for Nanotechnology, and Dept. of Mechanical Engineering, Univ. of Wisconsin, pp. 411-414.
Kim, Sang Ouk, et al., "Novel Complex Nanostructure from Directed Assembly of Block Copolymers on Incommensurate Surface Patterns," Adv. Mater., 2007, 19, pp. 3271-3275.
Kim, Seung Hyun, et al., "Highly Oriented and Ordered Arrays from Block Copolymers via Solvent Evaporation," Adv. Mater. 2004, 16, No. 3, Feb. 3, pp. 226-231.
Kim, Seung Hyun, et al., "Salt Complexation in Block Copolymer Thin Films," Macromolecules 2006, vol. 39, No. 24, 2006, pp. 8473-8479.
Kim, Seung Hyun, et al., "Solvent-Induced Ordering in Thin Film Diblock Copolymer/Homopolymer Mixtures," Advanced Mater., vol. 16, No. 23-24, Dec. 17, 2004, pp. 2119-2123.
Kim, SH, et al., "In Vitro Release Behavior of Dextran-methacrylate Hydrogels Using Doxorubicin and Other Model Compounds," J Biomater Appl., Jul. 2000; 15(1): 23-46 Abstract only.
Kim, SH, et al., "Synthesis and characterization of Dextran-methacrylate Hydrogels and Structural Study by SEM," J . Biomater Res., Mar. 15, 2000; 49(4): 517-27 Abstract only.
Kim, Su-Jin, et al., "Hybrid Nanofabrication Processes Utilizing Diblock Copolymer Nanotemplate Prepared by Self-assembled Monolayer Based Surface Neutralization," J. Vac. Sci. Technol. B26(1), Jan./Feb. 2008, © 2008 American Vacuum Society, pp. 189-194.
Knoll, A., et al., "Phase Behavior in Thin Films of Cylinder-Forming Block Copolymers," Physical Review Letters vol. 89, No. 3 Jul. 2002, The American Physical Society, pp. 035501-1 to 035501-4.
Krishnamoorthy et al., Block Copolymer Micelles as Switchable Templates for Nanofabrication, Languir, vol. 22, No. 8, Mar. 17, 2006, pp. 3450-3452.
Krishnamoorthy et al., Nonpatterned Self-Assembled Monolayers by Using Diblock Copolymer Micelles as nanometer-Scale Adsorption and Etch Masks, Advanced Materials, 2008, pp. 1-4.
Krishnamoorthy, S., et al., "Nanoscale Patterning with Block Copolymers," Materials Today, vol. 9, No. 9, Sep. 2006, pp. 40-47.
Kuhnline et al., "Detecting thiols in a microchip device using micromolded carbon ink electrodes modified with cobalt phthalocyanine", Analyst, vol. 131, pp. 202-207, (2006).
Ruiz, R., et al., "Density Multiplication and Improved Lighography by Directed Block Copolymer Assembly," Science, vol. 321, Aug. 15, 2008, pp. 936-939.
Ruiz, R., et al., "Induced Orientational Order in Symmetric Diblock Copolymer Thin-Films," Advanced Materials, vol. 19, No. 4, pp. 587-591, (2007).
Ryu, Du Yeol, et al., "Surface Modification with Cross-Linked Random Copolymers: Minimum Effective Thickness," Macromolecules, vol. 40, No. 12, 2007, American Chemical Society, pp. 4296-4300.
Sang et al., "Epitaxial self-assembly of block copolymers on lithographically defined nanopatterned substrates", Nature, vol. 24, pp. 411-414, (Jul. 2003).

Saraf, Ravi R., et al., "Spontaneous Planarization of Nanoscale Phase Separated Thin Film," Applied Physics Letters, vol. 80, No. 23, Jun. 10, 2002, American Institute of Physics, pp. 4425-4427.
Sato et al., Novel Antireflective Layer Using Polysilane for Deep Ultraviolet Lithography, J. Vac. Sci. Technol. B, vol. 17, No. 6, pp. 3398-3401 (1999).
Sawhney, A. S., et al., "Bioerodible Hydrogels Based on Photopolymerized Poly(ethylene glycol)-co-poly(a-hydroxy acid) Diacrylate Macromers," Macromolecules 1993, 26, American Chemical Society, pp. 581-587, Abstract only.
Segalman, R. A., "Patterning with Block Copolymer Thin Films," Materials Science and Engineering R 48 (2005), Elsevier B. V., pp. 191-226.
Shahrjerdi, D., et al., "Fabrication of Ni Nanocrystal Flash Memories Using a Polymeric Self-Assembly Approach," IEEE Electron Device Letters, vol. 28, No. 9, Sep. 2007, pp. 793-796.
Sharma, S. et al., "Ultrathin Poly(ethylene glycol) Films for Silicon-based Microdevices," Applied Surface Science, 206 (2003), Elsevier Science B.V., pp. 218-229.
Sigma-Aldrich, 312-315Tutorial regarding Materials for Lithography/Nanopatterning, http://www.sigmaaldrich.com/Area_of_Interest/Chemistry/Materials_Science/Micro_and_Nanoelectronic website, retrieved Aug. 27, 2007.
Sivaniah, E., et al., "Observation of Perpendicular Orientation in Symmetric Diblock Copolymer Thin Films on Rough Substrates," Macromolecules 2003, 36, American Chemical Society, pp. 5894-5896.
Sivaniah, et al., "Symmetric Diblock Copolymer Thin Films on Rough Substrates, Kinetics and Structure Formation in Pure Block Copolymer Thin Films," Macromolecules 2005, 38, American Chemical Society, pp. 1837-1849.
Sohn et al., Fabrication of the Multilayered Nanostructure of Alternating Polymers and Gold Nanoparticles with Thin Films of Self-Assembling Diblock Copolymers, Chem, Mater, vol. 13, pp. 1752-1757 (2001).
Solak, H. H., "Nanolithography with Coherent Extreme Ultraviolet Light," Journal of Physics D: Applied Physics, 2006, IOP Publishing Ltd., UK, pp. R171-188.
Srinvivasan, C., et al., "Scanning Electron Microscopy of Nanoscale Chemical Patterns," ACS Nano, vol. 1, No. 3, pp. 191-201, 2007.
Stoykovich, M. P., et al., "Directed Assembly of Block Copolymer Blends into Nonregular Device-Oriented Structures," Science, vol. 308, Jun. 3, 2005, pp. 1442-1446.
Stoykovich, M. P., et al., "Directed Self-Assembly of Block Copolymers for Nanolithography: Fabrication of Isolated Features and Essential Integrated Circuit Geometries," ACS Nano, vol. 1, No. 3, 2007, pp. 168-175.
Sundrani, D., et al., "Guiding Polymers to Perfection: Macroscopic Alignment of Nanoscale Domains," Nano Lett., vol. 4, No. 2, 2004, American Chemical Society, pp. 273-276.
Sundrani, D., et al., "Hierarchical Assembly and Compliance of Aligned Nanoscale Polymer Cylinders in Confinement," Langmuir 2004, vol. 20, No. 12, 2004, American Chemical Society, pp. 5091-5099.
Tadd et al, Spatial Distribution of Cobalt Nanoclusters in Block Copolymers, Langmuir, vol. 18, pp. 2378-2384 (2002).
Trimbach et al., "Block Copolymer Thermoplastic Elastomers for Microcontact Printing," Langmuir, 2003, vol. 19, p. 10957.
Truskett, V. M., et. al., "Trends in Imprint Lithography for Biological Applications," TRENDS in Biotechnology, vol. 24, No. 7, Jul. 2006, pp. 312-315.
Van Poll, M. L., et al., "a Self-Assembly Approach to Chemical Micropatterning of Poly(dimethylsiloxane)," Angew. Chem. Int. Ed. 2007, 46, pp. 6634-6637.
Wang, C., et al., "One Step Fabrication and characterization of Platinum Nanopore Electrode Ensembles formed via Amphiphilic Block Copolymer Self-assembly," Electrochimica Acta 52 (2006), pp. 704-709.
Wathier, M., et al., "Dendritic Macromers as in Situ Polymerizing Biomaterials for Securing Cataract Incisions," J. Am. Chem. Soc., 2004, 126 (40), pp. 12744-12745, Abstract only.

(56) References Cited

OTHER PUBLICATIONS

Winesett, D.A., et al., "Tuning Substrate Surface Energies for Blends of Polystyrene and Poly(methyl methacrylate)," Langmuir 2003, 19, American Chemical Society, pp. 8526-8535.

Wipf, "Handbook of Reagents for Organic Synthesis", 2005, John Wiley & Sons Ltd., p. 320.

Wu, C.Y., et al., "Self-Assembled Two-Dimensional Block Copolymers on Pre-patterned Templates with Laser Interference Lithography," IEEE, 2007, pp. 153-154.

Xia et al., An Approach to Lithographically Defined Self-Assembled Nanoparticle Films, Advanced Materials, vol. 18, pp. 930-933 (2006).

Xia, Younan, et al., "Soft Lithography," Annu. Rev. Mater. Sci., vol. 28, pp. 153-184, 1998.

Xiao, Shuaigang., et al., "Graphoepitaxy of Cylinder-forming Block Copolymers for Use as Templates to Pattern Magnetic Metal Dot Arrays," Nanotechnology 16, IPO Publishing Ltd, UK (2005), pp. S324-S329.

Xu et al., Electric Field Alignment of Symmetric Diblock Copolymer Thin Films, Department of Polymer Science and Engineering, University of Massachusetts, 5 pages (2003).

Xu et al., Interfacial Interaction Dependence of Microdomain Orientation in Diblock Copolymer Thin Films, Macromolecules, vol. 38, pp. 2802-2805 (2005).

Xu, F.J., et al., "Surface-Initiated Atom Transfer Radical Polymerization from Halogen-Terminated Si(111) (Si-X, X=Cl, Br) Surfaces for the Preparation of Well-Defined Polymer-Si Hybrids," Langmuir, vol. 21, No. 8, pp. 3221-3225, 2005.

Xu, Ting, et al., "The Influence of Molecular Weight on Nanoporous Polymer Films," Polymer 42, Elsevier Science Ltd., (2001) pp. 9091-9095.

Yamaguchi, T., et al., "Resist-Pattern Guided Self-Assembly of Symmetric Diblock Copolymer," Journal of Photopolymer Science and Technology, vol. 19, No. 3, pp. 385-388 (2006).

Yamaguchi, Toru, et al., "Two-dimensional Arrangement of Vertically Oriented Cylindrical Domains of Diblock Copolymers Using Graphoepitaxy with Artificial Guiding Pattern Layout," Microprocesses and Nanotechnology, 2007, Conference date Nov. 5-8, 2007, pp. 434-435.

Yan, Xiaohu, et al., "Preparation and Phase Segregation of Block Copolymer Nanotube Multiblocks," J. Am. Chem. Soc., vol. 126, No. 32, 2004, American Chemical Society, pp. 10059-10066.

Yang et al., Covalently Attached Graft Polymer Monolayer on Organic Polymeric Substrate via Confined Surface Inhibition Reaction, Journal of Polymer Science—A—Polymer Chemistry Edition, Sep. 28, 2006, pp. 745-755, vol. 45, Issue 5.

Yang, Xiao M., et al., "Guided Self-Assembly of Symmetric Diblock Copolymer Films on Chemically Nanopatterned Substrates," Macromolecules 2000, vol. 33, No. 26, 2000, American Chemical Society, pp. 9575-9582.

Yang, Xiaomin, et al., "Nanoscopic Templates Using Self-assembled Cylindrical Diblock Copolymers for Patterned Media," J. Vac. Sci. Technol. B 22(6), Nov./Dec. 2004, American Vacuum Society, pp. 3331-3334.

Yu et al., Contact Printing Beyond Surface Roughness: Liquid Supramolecular Nanostamping, Advanced Materials, vol. 19, 2007, pp. 4338-4342.

Yurt, Serkan, et al., "Scission of Diblock Copolymers into Their Constituent Blocks," Macromolecules 2006, vol. 39, No. 5, 2006, American Chemical Society, pp. 1670-1672.

Zaumseil et al., "Three-Dimensional and Multilayer Nanostructures Formed by Nanotransfer Printing," Nano Letters, 2003, vol. 3, No. 9, pp. 1223-1227.

Zehner, R. W., et al., "Selective Decoration of a Phase-Separated Diblock Copolymer with Thiol-Passivated Gold Nanocrystals," Langmuir, vol. 14, No. 2, pp. 241-244, Jan. 20, 1998.

Zhang et al., "Self-Assembled Monolayers of Terminal Alkynes on Gold," J. Am. Chem. Soc., vol. 129, No. 16, pp. 4876-4877, 2007.

Zhang, Mingfu, et al., "Highly Ordered Nanoporous Thin Films from Cleavable Polystyrene-block-poly(ethylene oxide)," Adv. Mater. 2007, 19, pp. 1571-1576.

Zhang, Yuan, et al., "Phase Change Nanodot Arrays Fabricated Using a Self-Assembly Diblock Copolymer Approach," Applied Physics Letter, 91, 013104, 2007, American Institute of Physics, pp. 013104 to 013104-3.

Zhao et al., Colloidal Subwavelength Nanostructures for Antireflection Optical Coatings, Optics Letters, vol. 30, No. 14, pp. 1885-1887 (2005).

Li, H, W. Huck; "Ordered Block-Copolymer Assembly Using Nanoimprint Lithography". Nano. Lett. (2004), vol. 4, No. 9, p. 1633-1636.

Cheng, J., C. Ross, H. Smith, E. Thomas; "Templated Self-Assembly of Block Copolymers: Top-Down Helps BottomUp". Adv. Mater. (2006), 18, p. 2505-2521.

US 9,087,699 B2

METHODS OF FORMING AN ARRAY OF OPENINGS IN A SUBSTRATE, AND RELATED METHODS OF FORMING A SEMICONDUCTOR DEVICE STRUCTURE

TECHNICAL FIELD

Embodiments of the disclosure relate to the field of semiconductor device design and fabrication. More specifically, embodiments of the disclosure relate to methods of forming an array of openings in a substrate, to related methods of forming a semiconductor device structure, and to a related semiconductor device structure.

BACKGROUND

A continuing goal of integrated circuit fabrication is to decrease the dimensions thereof. Integrated circuit dimensions can be decreased by reducing the dimensions and spacing of the constituent features or structures thereof. For example, by decreasing the dimensions and spacing of features (e.g., storage capacitors, access transistors, access lines, etc.) of a memory device, the overall dimensions of the memory device may be decreased while maintaining or increasing the storage capacity of the memory device.

Reducing the dimensions and spacing of semiconductor device features places ever increasing demands on the methods used to form the features. For example, due to limitations imposed by optics and radiation wavelengths, many conventional photolithographic methods cannot facilitate the formation of features having critical dimensions (e.g., widths, diameters, etc.) of less than about sixty (60) nanometers (nm). Electron beam (E-beam) lithography and extreme ultraviolet (EUV) lithography have been used to form features having critical dimensions less than 60 nm, but generally require complex processes and significant costs.

One approach for achieving features having critical dimensions of less than about 60 nm has been the use of pitch density multiplication processes, such as pitch density doubling processes. In a conventional pitch density doubling process, a photolithographic process is used to form photoresist lines over a sacrificial material over a substrate. The sacrificial material is etched using the photoresist lines to form mandrels, the photoresist lines are removed, spacers are formed on sides of the mandrels, and the mandrels are removed. The remaining spacers are used as a mask to pattern the substrate. Where the initial photolithography process formed one feature and one trench across a particular width of the substrate, after pitch density doubling, the same width of the substrate can include two smaller features and two smaller trenches, the width of each of the smaller trenches defined by the width of the spacers. Thus, the use of pitch density doubling can halve the minimum critical dimensions of features formed by the photolithographic processes, resulting in features having minimum critical dimension of about 30 nm. However, to achieve features having critical dimensions less than about 30 nm, the pitch density doubling process needs to be repeated (i.e., the process becomes a pitch density quadrupling process), significantly increasing processing time as well as energy and material costs.

Another approach for achieving semiconductor device features having critical dimensions of less than about 60 nm has been the use of self-assembling (SA) block copolymers. For example, an SA block copolymer deposited within a trench having particular graphoepitaxial characteristics (e.g., dimensions, wetting properties, etc.) may be annealed to form select morphology (e.g., spherical, lamellar, cylindrical, etc.) domains of one polymer block of the SA block copolymer within a matrix domain of another polymer block of the SA block copolymer. The select morphology domains or the matrix domain can be selectively removed, and the remaining select morphology domains or matrix domain utilized as an etch mask for patterning features into an underlying substrate. As the dimensions of the select morphology domains and the matrix domain are at least partially determined by the chain length of the SA block copolymer, feature dimensions much smaller than 60 nm are achievable (e.g., dimensions similar to those achievable through E-beam and EUV lithography processes). Such methods have, for example, been used to form close-packed, hexagonal arrays of openings in an underlying substrate. However, certain semiconductor device structures may utilize different (i.e., non-hexagonal) array configurations. For example, Dynamic Random Access Memory (DRAM) device structures may utilize rectilinear arrays of openings (e.g., contact openings) rather than hexagonal arrays of openings.

A need, therefore, exists for new, simple, and cost-efficient methods of forming a rectilinear array of openings for a semiconductor device structure, such as, for example, a rectilinear contact array for a memory device structure, that enables the formation of the closely packed openings having critical dimensions (e.g., widths, diameters, etc.) less than or equal to about 30 nm.

DETAILED DESCRIPTION

Figure 1:
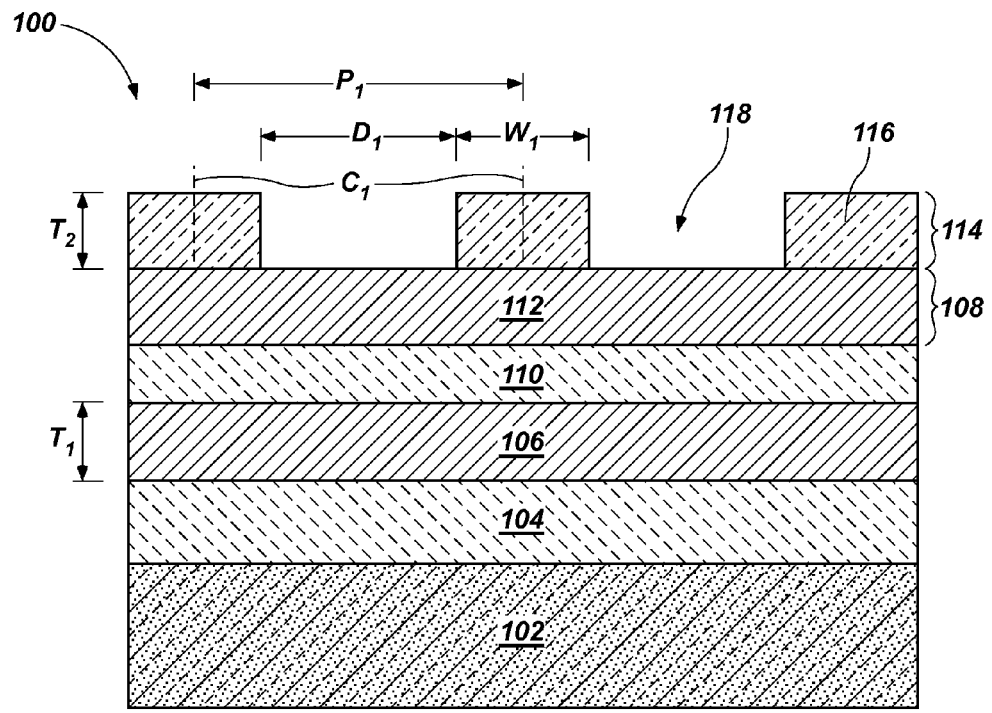
FIGS. 1 through 13B are cross-sectional (i.e., FIGS. 1 through 7A, 8A, 9A, 10A, 11A, 12A, and 13A) and top-down (FIGS. 7B, 8B, 9B, 10B, 11B, 12B, and 13B) views of a semiconductor device structure in accordance with embodiments of the disclosure, and illustrate a method of forming a rectilinear array of openings in a substrate of a semiconductor device structure, in accordance with embodiments of the disclosure.

Methods of forming a rectilinear array of openings (e.g., a rectilinear contact array) in a substrate are disclosed, as are related methods of forming a semiconductor device structure including the rectilinear array of openings, and a related semiconductor device structure including the rectilinear array of openings. In some embodiments, a template structure having the dimensions, spacing, and wetting characteristics for forming a rectilinear array of cylindrical domains of a first polymer within a matrix domain of a second polymer from a block copolymer material may be formed over a substrate by way of pitch density doubling processes. An appropriate block copolymer material may be deposited in wells defined by the template structure, the block polymer material may be processed (e.g., annealed) to form a self-assembled block copolymer material, and the cylindrical domains of the first polymer may be selectively removed to form a patterned polymer material. The patterned polymer material may be used as a mask to form a rectilinear array of openings in the substrate. The openings of the rectilinear array may each have substantially the same width, such as less than or equal to about 30 nm, and a pitch between adjacent openings may be substantially uniform, such as less than or equal to about 50 nm. The rectilinear array of openings may, for example, be utilized in a dynamic random access memory (DRAM) device. The methods of forming the rectilinear array of openings disclosed herein may decrease processing complexity, steps, and cost relative to conventional methods of forming a rectilinear array of openings. The methods of the disclosure may enable increased opening density, facilitating increased performance in semiconductor device structures (e.g., DRAM cells) and semiconductor devices (e.g., DRAM devices) that rely on high opening (e.g., contact) density.

As used herein, the term "rectilinear array" means and includes an array including rows of features that intersect columns of features at about a ninety degree (90°) angle. Accordingly, a "rectilinear array of openings" means and includes an array of openings including rows of openings that intersect columns of openings at about a ninety degree (90°) angle.

As used herein, the term "pitch" refers to the distance between identical points in two adjacent (i.e., neighboring) features. By way of non-limiting example, the pitch between two adjacent cylindrical domains may be viewed as the sum of the radii of the adjacent cylindrical domains and any space between the adjacent cylindrical domains. Stated another way, the pitch in the foregoing example may be characterized as the distance between the centers of the adjacent cylindrical domains.

As used herein, relational terms, such as "first," "second," "over," "top," "bottom," "underlying," etc., are used for clarity and convenience in understanding the disclosure and accompanying drawings and does not connote or depend on any specific preference, orientation, or order, except where the context clearly indicates otherwise.

As used herein, the term "substantially," in reference to a given parameter, property, or condition, means to a degree that one of ordinary skill in the art would understand that the given parameter, property, or condition is met with a small degree of variance, such as within acceptable manufacturing tolerances.

The following description provides specific details, such as material types, material thicknesses, and processing conditions in order to provide a thorough description of embodiments of the disclosure. However, a person of ordinary skill in the art will understand that the embodiments of the present disclosure may be practiced without employing these specific details. Indeed, the embodiments of the present disclosure may be practiced in conjunction with conventional fabrication techniques employed in the industry. In addition, the description provided below does not form a complete process flow for manufacturing a semiconductor device. The semiconductor device structures described below do not form a complete semiconductor device. Only those process acts and structures necessary to understand the embodiments of the disclosure are described in detail below. Additional acts to form the complete semiconductor device from the semiconductor device structures may be performed by conventional fabrication techniques. Also note, any drawings accompanying the present application are for illustrative purposes only, and are thus not drawn to scale. Additionally, elements common between figures may retain the same numerical designation.

FIGS. 1 through 13B, are simplified cross-sectional (i.e., FIGS. 1 through 7A, 8A, 9A, 10A, 11A, 12A, and 13A) and top-down (i.e., FIGS. 7B, 8B, 9B, 10B, 11B, 12B, and 13B) views illustrating embodiments of a method of forming a rectilinear array of openings in a substrate of a semiconductor device structure, such as a rectilinear contact array for a DRAM device structure. With the description provided below, it will be readily apparent to one of ordinary skill in the art that the methods described herein may be used in various devices. In other words, the methods of the disclosure may be used whenever it is desired to form a rectilinear array of openings in a substrate.

Referring to FIG. 1, a semiconductor device structure 100 may include a substrate 102, a substrate masking material 104 over the substrate 102, a template material 106 over the substrate masking material 104, template masking materials 108 over the template material 106, and a patterned photoresist material 114 over the template masking materials 108. As used herein, the term "substrate" means and includes a base material or other construction upon which additional materials are formed. The substrate 102 may be a semiconductor substrate, a base semiconductor layer on a supporting structure, a metal electrode or a semiconductor substrate having one or more layers, structures or regions formed thereon. The substrate 102 may be a conventional silicon substrate or other bulk substrate comprising a layer of semiconductive material. As used herein, the term "bulk substrate" means and includes not only silicon wafers, but also silicon-on-insulator (SOI) substrates, such as silicon-on-sapphire (SOS) substrates and silicon-on-glass (SOG) substrates, epitaxial layers of silicon on a base semiconductor foundation, and other semiconductor or optoelectronic materials, such as silicon-germanium, germanium, gallium arsenide, gallium nitride, and indium phosphide. The substrate 102 may be doped or undoped.

The substrate masking material 104 may be a material that is selectively etchable relative to a domain of a self-assembled block copolymer material to be formed over the substrate masking material 104, as described in further detail below. As used herein, a material is "selectively etchable" relative to another material if the material exhibits an etch rate that is at least about five times (5×) greater than the etch rate of another material, such as about ten times (10×) greater, about twenty times (20×) greater, or about forty times (40×) greater. The substrate 102 may be selectively etchable relative to the substrate masking material 104. In some embodiments, the substrate masking material 104 is formed of and includes amorphous carbon. A thickness of the substrate masking material 104 may be selected at least partially based on the etch chemistries and process conditions used to form the rectilinear array of openings of the disclosure, as described in further detail below. By way of non-limiting example, the substrate masking material 104 may have a thickness within a range of from about 100 nanometers (nm) to about 1000 nm, such as from about 200 nm to about 800 nm, or from about 300 nm to about 700 nm. In some embodiments, the substrate masking material 104 has a thickness of about 600 nm.

The template material 106 may be a material that, upon being patterned, facilitates forming a self-assembled block copolymer material including a rectilinear array of cylindrical domains of a first polymer within a matrix domain of a second polymer, as described in further detail below. The template material 106 may, for example, be a material that is preferential wetting to a polymer block (e.g., a minority block, or a majority block) of the block copolymer material (as well as any homopolymers included in the block copolymer material that are of the same polymer type as the polymer block). As a non-limiting example, template material 106 may be formed of and include at least one of a silicon oxide, a silicon nitride, a silicon oxycarbide, and a dielectric anti-reflective coating (DARC) (e.g., a silicon oxynitride, such as a silicon-rich silicon oxynitride). In some embodiments, the template material 106 is selected to be preferential wetting toward a polymethylmethacrylate (PMMA) block of poly (styrene-b-methylmethacrylate) (PS-b-PMMA). In additional embodiments, the template material 106 is selected to be preferential wetting toward a polydimethylsiloxane (PDMS) block of poly(styrene-block-dimethylsiloxane) (PS-b-PDMS). The template material 106 may have a thickness $T_1$ conducive to the patterning of the template material 106 to form a template structure, as described in further detail below. By way of non-limiting example, the thickness $T_1$ of the template material 106 may be within a range of from about 50 nanometers (nm) to about 500 nm, such as from about 50 nm to about 100 nm. In some embodiments, the thickness $T_1$ of the template material 106 is about 75 nm.

The template masking materials 108 may include materials that aid in the patterning of the template material 106. For example, as depicted in FIG. 1, the template masking materials 108 may include a protective material 110 over the template material 106 and a hard mask material 112 over the protective material 110. Each of the protective material 110 and the hard mask material 112 may be selectively etchable relative to spacers to be formed over the template masking materials 108. The protective material 110 and the hard mask material 112 may be the same as or different than the substrate masking material 104 and the template material 106, respectively. By way of non-limiting example, the protective material 110 may be formed of and include amorphous carbon, and the hard mask material 112 may be formed of and include at least one of silicon, a silicon oxide, a silicon nitride, a silicon oxycarbide, aluminum oxide, and a silicon oxynitride. The protective material 110 may have a thickness within a range of from about 50 nm to about 300 nm, such as from about 60 nm to about 200 nm. The hard mask material 112 may have a thickness within a range of from about 10 nm to about 50 nm, such as from about 10 nm to about 40 nm. In some embodiments, the protective material 110 has a thickness of about 70 nm, and the hard mask material 112 has a thickness of about 26 nm. In embodiments where the template material 106 is selectively etchable relative to a spacer material to be formed thereover, at least a portion of the template masking materials 108 (e.g., at least one of the protective material 110 and the hard mask material 112) may, optionally, be omitted.

Each of the substrate 102, the substrate masking material 104, the template material 106, and the template masking materials 108 (if present) may be formed using conventional processes including, but not limited to, physical vapor deposition ("PVD"), chemical vapor deposition ("CVD"), atomic layer deposition ("ALD"), or spin-coating. PVD includes, but is not limited to, sputtering, evaporation, or ionized PVD. Such processes are known in the art and, therefore, are not described in detail herein.

The patterned photoresist material 114 may include parallel photoresist lines 116 separated by first trenches 118. As used herein, the term "parallel" means substantially parallel. Each of the parallel photoresist lines 116 may be formed of and include a conventional photoresist, such as a photoresist compatible with 13.7 nm, 157 nm, 193 nm, 248 nm, or 365 nm wavelength systems, a photoresist compatible with 193 nm wavelength immersion systems, or a photoresist compatible with electron beam lithographic systems. By way of non-limiting example, each of the parallel photoresist lines 116 may be formed of and include an argon fluoride (ArF) sensitive photoresist (i.e., a photoresist suitable for use with an ArF light source), or a krypton fluoride (KrF) sensitive photoresist (i.e., a photoresist suitable for use with a KrF light source).

Each of the parallel photoresist lines 116 may have substantially the same width $W_1$, thickness $T_2$, and length (not shown). In addition, the parallel photoresist lines 116 may be regularly spaced by a distance $D_1$ (i.e., the width of each of the first trenches 118). Accordingly, a pitch $P_1$ between centerlines $C_1$ of adjacent parallel photoresist lines may be substantially uniform throughout the patterned photoresist material 114. The dimensions and spacing of the parallel photoresist lines 116 may be selected to provide desired dimensions and spacing to parallel spacers to be formed on the parallel photoresist lines 116. For example, the width $W_1$ and the centerline $C_1$ location of each of the parallel photoresist lines 116 may be selected to facilitate the formation of parallel spacers exhibiting smaller dimensions and decreased pitch relative to the parallel photoresist lines 116, as described in further detail below. In some embodiments, the width $W_1$ of each of the parallel photoresist lines 116 is about 50 nm, the distance $D_1$ between adjacent parallel photoresist lines is about 70 nm, and the pitch $P_1$ between adjacent parallel photoresist lines is about 120 nm.

The patterned photoresist material 114 may be formed using conventional processing techniques, which are not described in detail herein. By way of non-limiting example, a photoresist material (not shown) may be formed over the template masking materials 108 and exposed to an appropriate wavelength of radiation through a reticle (not shown) and then developed. The parallel photoresist lines 116 may correlate to portions of the photoresist material remaining after the development, and the first trenches 118 may correlate to portions of the photoresist material removed during the development.

Figure 2:
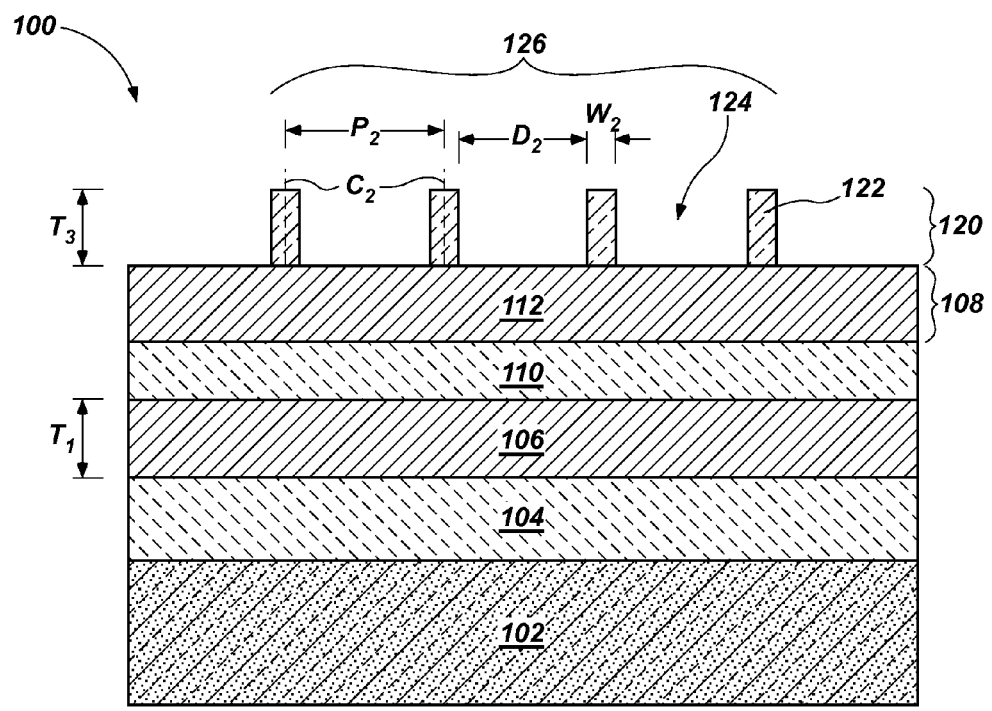

Referring to next to FIG. 2, the patterned photoresist material 114 (FIG. 1) may be used to form a patterned spacer material 120 including parallel spacers 122 separated by second trenches 124. The patterned spacer material 120 may define a first pattern 126 to be transferred to the template material 106, as described in further detail below. Each of the parallel spacers 122 may be formed of and include a material suitable for use as a mask for selectively removing (e.g., etching) of portions of the template masking materials 108 and the template material 106. By way of non-limiting example, each of the parallel spacers 122 may be formed of and include a silicon oxide or a silicon nitride. In some embodiments, each of the parallel spacers 122 is formed of and includes a silicon oxide.

Each of the parallel spacers 122 may have substantially the same width $W_2$, thickness $T_3$, and length (not shown). The thickness $T_3$ of each of the parallel spacers 122 may be substantially the same as the thickness $T_2$ of each of the parallel photoresist lines 116 (FIG. 1). In addition, the parallel spacers 122 may be oriented parallel to one another, and may be regularly spaced by a distance $D_2$ (i.e., the width of each of the second trenches 124) that is substantially the same as the width $W_1$ of each of the parallel photoresist lines 116. A pitch $P_2$ between centerlines $C_2$ of adjacent parallel spacers may be equal to about half of the pitch $P_1$ between the centerlines $C_1$ of adjacent photoresist lines of the patterned photoresist material 114 (FIG. 1). The dimensions and spacing of the parallel spacers 122 may be selected to provide desired dimensions and spacing for features of a template structure to be formed using the patterned spacer material 120, as described in further detail below. The width $W_2$ of each of the parallel spacers 122 may be within a range of from about 20 percent to about 40 percent of a target (e.g., desired) pitch between adjacent openings of a rectilinear array of openings to be formed using the template structure, such as from about 20 percent to about 30 percent of the target pitch. The distance $D_2$ between each of the parallel spacers 122 may be within a range of from about 180 percent to about 160 percent of the target pitch between adjacent openings of the rectilinear array of openings to be formed, such as from about 180 percent to about 170 percent of the target pitch. The pitch $P_2$ between adjacent parallel spacers of the patterned spacer material 120 may be about two times (2×) the target pitch between adjacent openings of the rectilinear array of openings to be formed.

By way of non-limiting example, if a target pitch between adjacent openings of the rectilinear array of openings to be formed is about 30 nm, the width $W_2$ of each of the parallel spacers 122 may be within a range of from about 6 nm to about 12 nm, the distance $D_2$ between adjacent parallel spacers of the patterned spacer material 120 may be within a range of from about 54 nm and about 48 nm, and the pitch $P_2$ between centerlines $C_2$ of adjacent parallel spacers of the patterned spacer material 120 may be about 60 nm. In some embodiments, the width $W_2$ of each of the parallel spacers 122 is about 10 nm, the distance $D_2$ between adjacent parallel spacers of the patterned spacer material 120 is about 50 nm, and the pitch $P_2$ between adjacent parallel spacers of the patterned spacer material 120 is about 60 nm.

A pitch density doubling process may be utilized to form the patterned spacer material 120 using the patterned photoresist material 114. For example, referring collectively to FIGS. 1 and 2, a spacer material (not shown) may be conformally formed (e.g., deposited using a PVD process, a CVD process, an ALD process, or a spin-coating process) over exposed surfaces of the parallel photoresist lines 116 and the template masking materials 108. A thickness of the spacer material may correspond to the width $W_2$ of the parallel spacers 122 to be formed. An anisotropic etching process may be performed to remove the spacer material from horizontal surfaces of the parallel photoresist lines 116 and the template masking materials 108, while maintaining the spacer material on vertical surfaces of the parallel photoresist lines 116. As used herein, each of the terms "horizontal" and "lateral" means and includes extending in a direction substantially parallel to the substrate 102, regardless of the orientation of the substrate 102. Accordingly, as used herein, each of the terms "vertical" and "longitudinal" means and includes extending in a direction substantially perpendicular to the substrate 102, regardless of the orientation of the substrate 102. The parallel photoresist lines 116 may then be removed (e.g., etched, such as dry etched with a silicon-dioxide-containing plasma), resulting in the patterned spacer material 120.

In additional embodiments, the patterned spacer material 120 may be formed using structures other than the parallel photoresist lines 116 of the patterned photoresist material 114. Such structures may, for example, be utilized if forming the spacer material over exposed surfaces of the parallel photoresist lines 116 would damage or degrade (e.g., thermally degrade) the parallel photoresist lines 116. By way of non-limiting example, a pattern defined by the patterned photoresist material 114 may be transferred (e.g., by way of at least one etching process) to the template masking materials 108 to form a patterned template masking material (not shown). The patterned spacer material 120 may then be formed using the patterned template masking material through a process substantially similar to that described above in relation to forming the patterned spacer material 120 using the patterned photoresist material 114.

Figure 3:
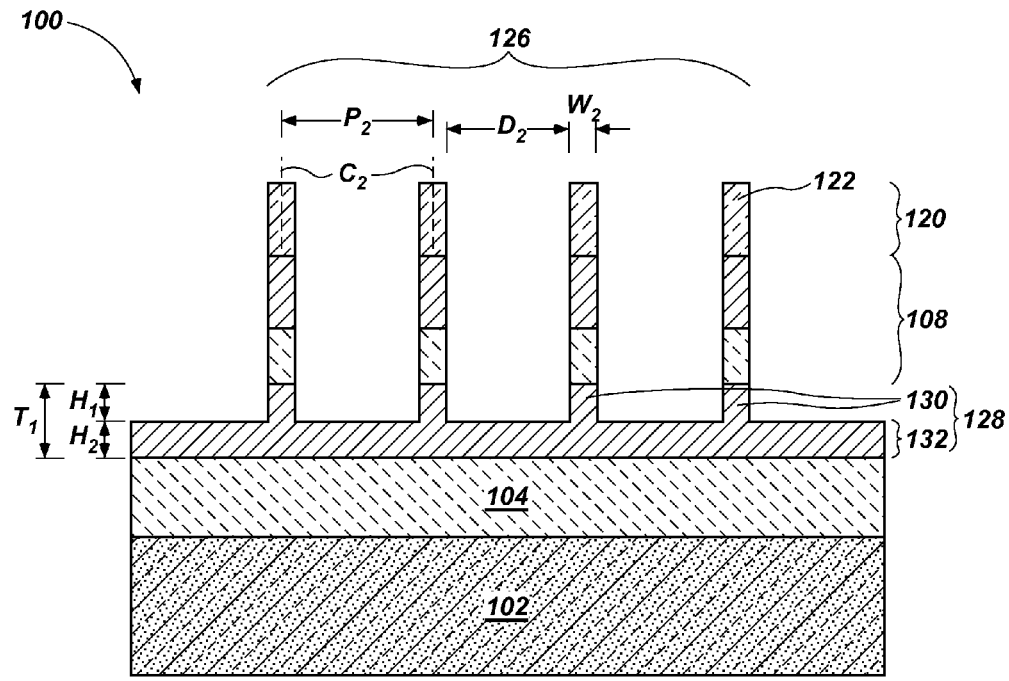

Referring to FIG. 3, the first pattern 126 defined by the patterned spacer material 120 may be transferred or extended into the template material 106 (FIG. 2) to form an intermediate template structure 128 including parallel features 130 protruding from a base 132. The parallel features 130 may have substantially the same width $W_2$, length (not shown), and pitch $P_2$ as each of the parallel spacers 122. A height $H_1$ of each of the parallel features 130 may be within a range of from about 55 percent to about 45 percent of the thickness $T_1$ of the template material 106. A height $H_2$ of the base 132 may be equal to the difference between the height $H_1$ of each of the parallel features 130 and the thickness $T_1$ of the template material 106. In some embodiments, the width $W_2$ of each of the parallel features 130 is about 10 nm, the pitch $P_2$ between adjacent parallel features is about 60 nm, the height $H_1$ of each of the parallel features 130 is about 35 nm, and the height $H_2$ of the base 132 is about 40 nm.

To form the intermediate template structure 128, the parallel spacers 122 of the patterned spacer material 120 may be used as a mask for at least one etching process (e.g., an anisotropic etching process) to substantially remove unmasked portions (i.e., portions not underlying the parallel spacers 122) of each of the template masking materials 108 and the template material 106. The unmasked portions of the template masking materials 108 may be completely removed, and the unmasked portions of the template material 106 may be partially removed. The etching process may, for example, extend the first pattern 126 from about 45 percent to about 55 percent of the way through the template material 106. As a non-limiting example, if the thickness $T_1$ of the template material 106 is about 75 nm, the first pattern 126 may be extended from about 35 nm to about 40 nm into the template material 106.

Figure 4:
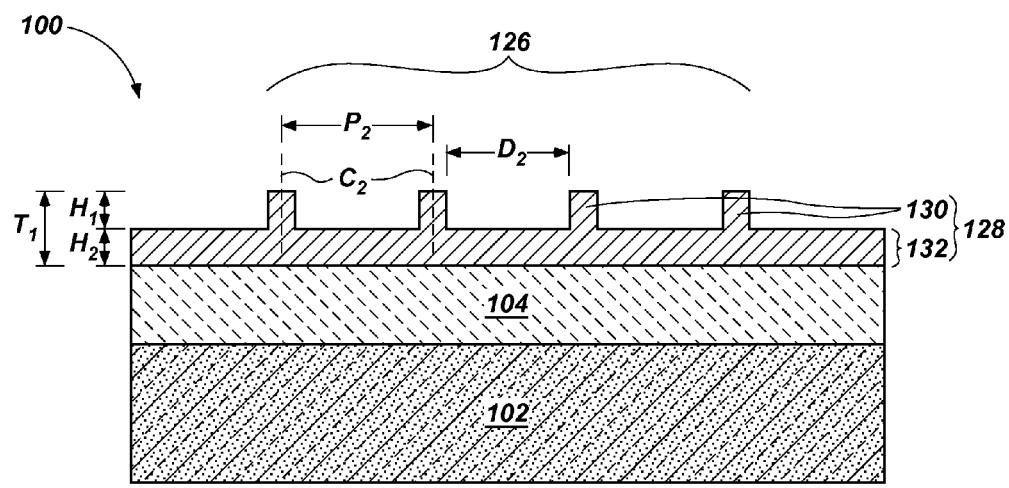

Following the formation of the intermediate template structure 128, remaining portions of the parallel spacers 122 and the template masking materials 108 may be removed, as depicted in FIG. 4. The remaining portions of the parallel spacers 122 and the template masking materials 108 may be removed using conventional processes, such as conventional etching processes, which are not described in detail herein.

Figure 5:
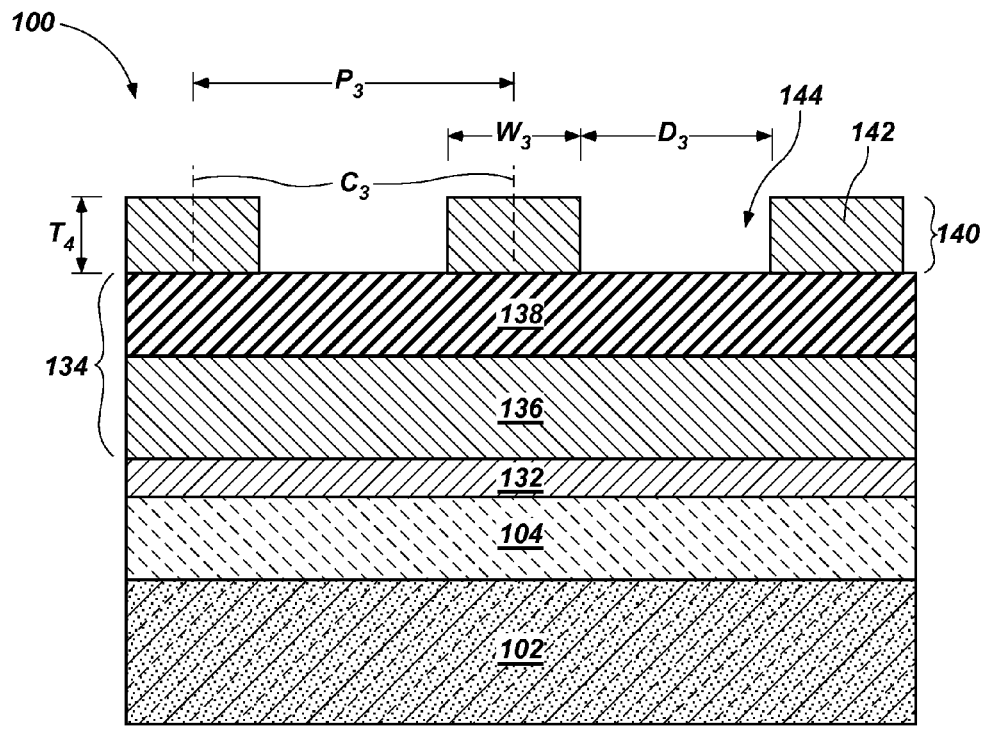

Referring to FIG. 5, which illustrates a cross-sectional view of the semiconductor device structure 100 taken from a viewpoint approximately 90 degrees clockwise of that of FIGS. 1 through 4, additional template masking materials 134 may be formed over the intermediate template structure 128, and another patterned photoresist material 140 may be formed over the additional template masking materials 134. In FIG. 5, the base 132 of the intermediate template structure 128 is shown, but the parallel features 130 are not illustrated because they are covered by the additional template masking materials 134. The additional template masking materials 134 may include materials that aid in further patterning the intermediate template structure 128 (FIG. 4). For example, the additional template masking materials 134 may include an additional protective material 136 over the intermediate template structure 128, and an additional hard mask material 138 over the additional protective material 136. Each of the additional protective material 136 and the additional hard mask material 138 may be selectively etchable relative to additional parallel spacers to be formed over the additional template masking materials 134. The additional protective material 136 and the additional hard mask material 138 may be the same as or different than the protective material 110 and the hard mask material 112 previously described with reference to FIG. 1, respectively. By way of non-limiting example, the additional protective material 136 may be formed of and include amorphous carbon, and the additional hard mask material 138 may be formed of and include at least one of silicon, a silicon oxide, a silicon nitride, a silicon oxycarbide, aluminum oxide, and a silicon oxynitride.

The additional protective material 136 may have a thickness sufficient to cover and surround each of the parallel features 130 (FIG. 4) of the intermediate template structure 128, such as a thickness within a range of from about 40 nm to about 80 nm, or from about 50 nm to about 60 nm. The additional hard mask material 138 may have a thickness within a range of from about 10 nm to about 50 nm, such as from about 10 nm to about 40 nm. In some embodiments, the additional hard mask material 138 has a thickness of about 80 nm, and the additional hard mask material 138 has a thickness of about 26 nm. In embodiments where the intermediate template structure 128 is selectively etchable relative to an additional spacer material to be formed thereover, at least a portion of the additional template masking materials 134 (e.g., the additional hard mask material 138) may, optionally, be omitted. The additional template masking materials 134 may be formed using conventional processes (e.g., CVD, PVD, ALD, or spin-coating), which are not described in detail herein.

The another patterned photoresist material 140 may include additional parallel photoresist lines 142 separated by third trenches 144. The additional parallel photoresist lines 142 may be formed of and include a conventional photoresist (e.g., an ArF sensitive photoresist, a KrF sensitive photoresist, etc.) that is the same as or different than that of the parallel photoresist lines 116 of the patterned photoresist material 114, previously described with respect to FIG. 1. The additional parallel photoresist lines 142 may have substantially similar dimensions and spacing as the parallel photoresist lines 116, except oriented in a direction substantially perpendicular to that of the parallel features 130 (FIG. 4) of the intermediate template structure 128 (i.e., perpendicular to the direction of the parallel photoresist lines 116). For example, each of the additional parallel photoresist lines 142 may have a width $W_3$, thickness $T_4$, and length (not shown) substantially the same as the width $W_1$, the thickness $T_2$, and the length (not shown) of the parallel photoresist lines 116, respectively. In additional embodiments, at least one of the thickness $T_4$ and the length of each of the additional parallel photoresist lines 142 may be different than at least one of the thickness $T_2$ and the length of the parallel photoresist lines 116. The additional parallel photoresist lines 142 may be regularly spaced by a distance $D_3$ that is substantially the same as the distance $D_1$ between each of the parallel photoresist lines 116. A pitch $P_3$ between centerlines $C_3$ of adjacent photoresist lines of the another patterned photoresist material 140 may be substantially the same as the pitch $P_1$ between the centerlines $C_1$ of the adjacent photoresist lines of the patterned photoresist material 114. In some embodiments, the width $W_3$ of each of the additional parallel photoresist lines 142 is about 50 nm, the distance $D_3$ between adjacent additional parallel photoresist lines is about 70 nm, and the pitch $P_3$ between the centerlines $C_3$ of adjacent additional parallel photoresist lines is about 120 nm. The another patterned photoresist material 140 may be formed using conventional processes, such as those previously described in relation to forming the patterned photoresist material 114.

Figure 6:
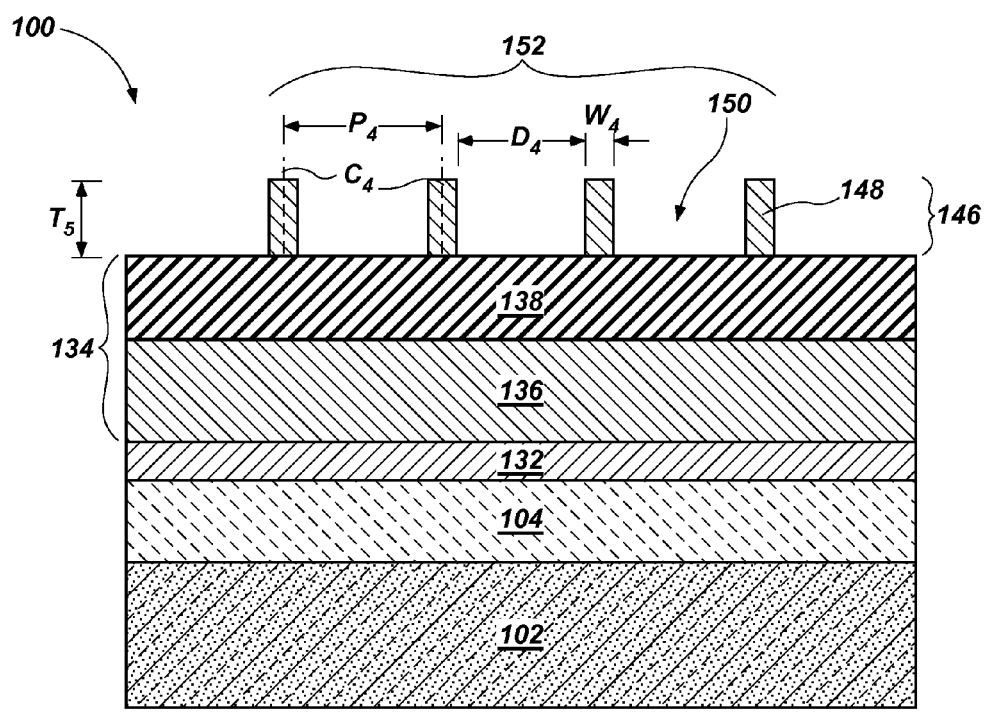

Referring to next to FIG. 6, the another patterned photoresist material 140 (FIG. 5) may be used to form another patterned spacer material 146 including additional parallel spacers 148 separated by fourth trenches 150. The another patterned spacer material 146 may define a second pattern 152 to be transferred to the intermediate template structure 128 (FIG. 4), as described in further detail below. Each of the additional parallel spacers 148 may be formed of and include a material suitable for use as a mask for selectively removing (e.g., etching) portions of the additional template masking materials 134 and the intermediate template structure 128. The material of the additional parallel spacers 148 may be the same as or different than the material of the parallel spacers 122 of the patterned spacer material 120, previously described with respect to FIG. 2. In some embodiments, each of the additional parallel spacers 148 is formed of and includes a silicon oxide.

The dimensions and spacing of the additional parallel spacers 148 may be selected to provide desired dimensions and spacing for features of a template structure to be formed using the another patterned spacer material 146, as described in further detail below. The additional parallel spacers 148 may have substantially similar dimensions and spacing as the parallel spacers 122 of the patterned spacer material 120, except oriented in a direction substantially perpendicular to that of the parallel features 130 (FIG. 4) of the intermediate template structure 128 (i.e., perpendicular to the direction of the parallel spacers 122). For example, each of the additional parallel spacers 148 may have a width $W_4$, thickness $T_5$, and length (not shown) substantially the same as the width $W_2$, the thickness $T_3$, and the length (not shown) of the parallel spacers 122, respectively. Accordingly, the width $W_4$ of each of the additional parallel spacers 148 may be within a range of from about 20 percent to about 40 percent of a target pitch between adjacent openings of the rectilinear array of openings to be formed using the template structure, such as from about 20 percent to about 30 percent of the target pitch. In further embodiments, at least one of the thickness $T_5$ and the length of the each of the additional parallel spacers 148 may be different than at least one of the thickness $T_3$ and the length of the parallel spacers 122. In addition, the additional parallel spacers 148 may be regularly spaced by a distance $D_4$ (i.e., equal to the width $W_3$ of each of the additional parallel photoresist lines 142), that is substantially the same as the distance $D_2$ between each of the parallel spacers 122. Accordingly, the distance $D_4$ between adjacent additional parallel spacers 148 may be within a range of from about 180 percent to about 160 percent of the target pitch between adjacent openings of the rectilinear array of openings to be formed using the template structure, such as from about 180 percent to about 170 percent of the target pitch. A pitch $P_4$ between centerlines $C_4$ of adjacent additional parallel spacers of the another patterned spacer material 146 may be substantially the same as the pitch $P_2$ between the centerlines $C_2$ of the adjacent parallel spacers of the patterned spacer material 120 (i.e., equal to about half of the pitch $P_3$ between centerlines $C_3$ of adjacent additional parallel photoresist lines of the additional parallel photoresist lines 142). Accordingly, the pitch $P_4$ between adjacent additional parallel spacers of the another patterned spacer material 146 may be equal to about two times (2×) the target pitch between adjacent openings of the rectilinear array of openings to be formed using the template structure.

By way of non-limiting example, if a target pitch between adjacent openings of the rectilinear array of openings to be formed is about 30 nm, the width $W_4$ of each of the additional parallel spacers 148 may be within a range of from about 6 nm to about 12 nm, the distance $D_4$ between adjacent additional parallel spacers of the another patterned spacer material 146 may be within a range of from about 54 nm and about 48 nm, and the pitch $P_4$ between centerlines $C_4$ of adjacent additional parallel spacers of the another patterned spacer material 146 may be about 60 nm. In some embodiments, the width $W_4$ of each of the additional parallel spacers 148 is about 10 nm, the distance $D_4$ between adjacent additional parallel spacers of the another patterned spacer material 146 is about 50 nm, and the pitch $P_4$ between adjacent parallel spacers of the another patterned spacer material 146 is about 60 nm. The another patterned spacer material 146 may be formed using processes substantially similar to those previously described with respect to forming the patterned spacer material 120.

Figure 7A:
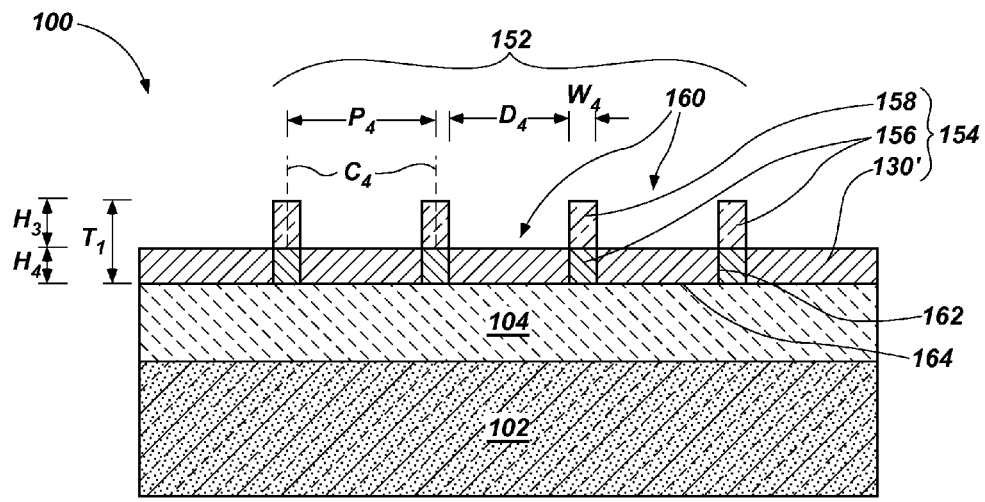
Figure 7B:
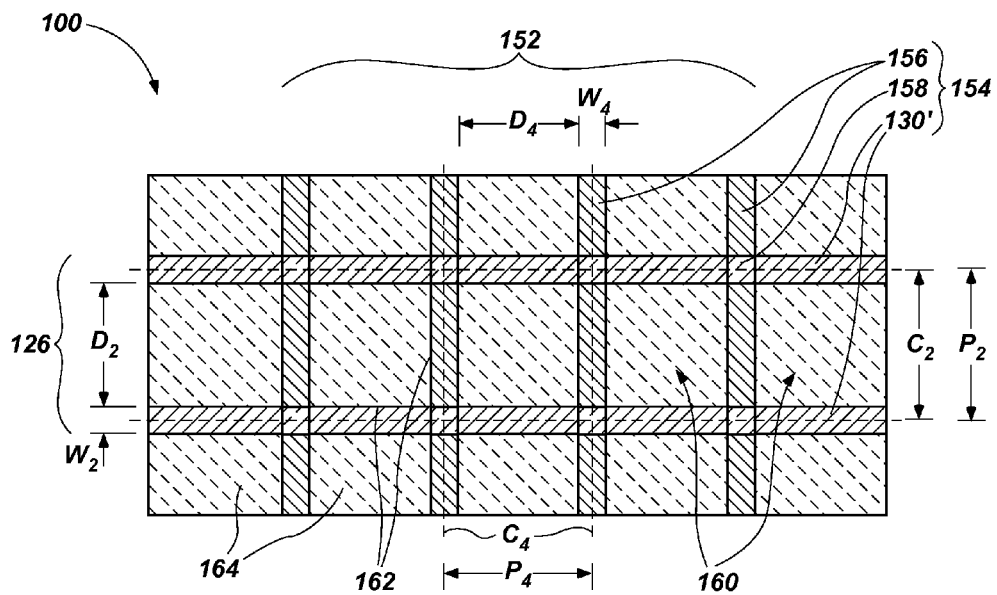

Referring to FIGS. 7A and 7B, the first pattern 152 defined by the another patterned spacer material 146 (FIG. 6) may be transferred or extended into the intermediate template structure 128 (FIG. 4) to form a template structure 154. The template structure 154 may include parallel features 130' (described in more detail below), additional parallel features 156, and elevated pillars 158. The parallel features 130' may intersect with the additional parallel features 156 to at least partially define wells 160. The elevated pillars 158 may protrude from the locations where the parallel features 130 and the additional parallel features 156 intersect. A height $H_3$ of the elevated pillars 158 may be equal to the difference between a height $H_4$ of each of the parallel features 130 and the additional parallel features 156 and the thickness $T_1$ of the template material 106 (FIGS. 1 and 2). In some embodiments, the height $H_3$ of the elevated pillars 158 is about 40 nm.

The parallel features 130' may be substantially similar (e.g., in terms of dimensions and spacing) to the parallel features 130 of the intermediate template structure 128 previously described with reference to FIG. 4, except that, as a result of extending the second pattern 152 into the intermediate template structure 128, the parallel features 130' may be formed from what used to be portions of the base 132 underlying the parallel features 130. Thus, as shown in FIG. 7B, the parallel features 130' of the template structure 154 may have substantially the same width $W_2$, length (not numbered), and pitch $P_2$ as the parallel features 130 of the intermediate template structure 128 (FIG. 4).

The additional parallel features 156 may have substantially the same width $W_4$, length (not shown), and pitch $P_4$ as each of the additional parallel spacers 148 (FIG. 6). The additional parallel features 156 may also have substantially the same dimensions and spacing as the parallel features 130', except oriented in a direction substantially perpendicular to that of the parallel features 130'. For example, referring to FIG. 7B, the width $W_4$ of each of the additional parallel features 156 may be substantially the same as the width $W_2$ of each of the parallel features 130', the distance $D_4$ between adjacent additional parallel features of the additional parallel features 156 may be substantially the same as the distance $D_2$ between adjacent parallel features of the parallel features 130', and the pitch $P_4$ between centerlines $C_4$ of adjacent additional parallel features of the additional parallel features 156 may be substantially the same as the pitch $P_2$ between centerlines $C_2$ of adjacent parallel features of the parallel features 130. Thus, the template structure 154 may include intersecting parallel features (i.e., the parallel features 130', and the additional parallel features 156) defining substantially rectangular (e.g., square) wells. In addition, as illustrated in FIG. 7A, each of the additional parallel features 156 and the parallel features 130' may have substantially the same height $H_3$.

Since the parallel features 130' and the additional parallel features 156 have substantially the same dimensions and spacing as the parallel spacers 122 and the additional parallel spacers 148, the width $W_2$ of each of the parallel features 130' and the width $W_4$ of each of the additional parallel features 156 may both be within a range of from about 20 percent to about 40 percent of a target pitch between adjacent openings of a rectilinear array of openings to be formed using the template structure 154, such as from about 20 percent to about 30 percent of the target pitch. In addition the distance $D_2$ between each of the parallel spacers 122 and the distance $D_4$ between of the additional parallel spacers 148 may be within a range of from about 180 percent to about 160 percent of the target pitch between adjacent openings of the rectilinear array of openings to be formed using the template structure 154, such as from about 180 percent to about 170 percent of the target pitch. Further, the pitch $P_2$ between centerlines $C_2$ of adjacent parallel features of the parallel features 130' and the pitch $P_4$ between centerlines $C_4$ of adjacent additional parallel features of the additional parallel features 156 may both be about two times (2×) the target pitch between adjacent openings of the rectilinear array of openings. Still further, the height $H_3$ of each of the parallel features 130' and the additional parallel features 156 may be within a range of from about one-half (½) the target pitch between adjacent openings of the rectilinear array of openings and about three times (3×) the target pitch between adjacent openings of the rectilinear array of openings, such as from about one times (1×) the target pitch and about two times (2×) the target pitch.

By way of non-limiting example, if a target pitch between adjacent openings of the rectilinear array of openings to be formed is about 30 nm, the width $W_2$ of each of the parallel features 130' and the width $W_4$ of each of the additional parallel features 156 may be within a range of from about 6 nm to about 12 nm, the distance $D_2$ between adjacent parallel features of the parallel features 130' and the distance $D_4$ between adjacent additional parallel features of the additional parallel features 156 may both be within a range of from about 54 nm and about 48 nm, the pitch $P_2$ between centerlines $C_2$ of adjacent parallel features of the parallel features 130' and the pitch $P_4$ between centerlines $C_4$ of adjacent additional parallel features of the additional parallel features 156 may both be about 60 nm, and the height $H_3$ of each of the parallel features 130' and the additional parallel features 156 may be within a range of from about is about 15 nm to about 90 nm. In some embodiments, the width $W_2$ of each of the parallel features 130' and the width $W_4$ of each of the additional parallel features 156 are both about 10 nm, the distance $D_2$ between adjacent parallel features of the parallel features 130' and the distance $D_4$ between adjacent additional parallel features of the additional parallel features 156 are both about 50 nm, the pitch $P_2$ between centerlines $C_2$ of adjacent parallel features of the parallel features 130' and the pitch $P_4$ between centerlines $C_4$ of adjacent additional parallel features of the additional parallel features 156 are both about 60 nm, and the height $H_3$ of each of the parallel features 130' and the additional parallel features 156 is about 35 nm.

As depicted in FIGS. 7A and 7B, the parallel features 130' and the additional parallel features 156 may define sidewalls 162 of each the wells 160, and the substrate masking material 104 may define a floor 164 of each of the wells 160. Thus, if the parallel features 130' and the additional parallel features 156 have substantially the same dimensions and spacing, each of the wells 160 may have substantially the same shape (e.g., substantially rectangular, such as substantially square), dimensions, and spacing. In some embodiments, each of the wells 160 has a square lateral cross-sectional shape, a lateral cross-sectional area of about 2500 nm$^2$, a height of about 35 nm, and is spaced apart from an adjacent well by about 10 nm.

Referring collectively to FIGS. 4, 6, and 7A, to form the template structure 154, the additional parallel spacers 148 of the another patterned spacer material 146 may be used as a mask for at least one etching process (e.g., an anisotropic etching process) to remove unmasked portions (e.g., portions not underlying the additional parallel spacers 148) of each of the additional template masking materials 134 and the intermediate template structure 128 (FIG. 4). The unmasked portions of the additional template masking materials 134 may be completely removed, and the unmasked portions of the intermediate template structure 128 may be partially removed. The etching process may, for example, uniformly remove unmasked portions of the intermediate template structure 128 to completely remove unmasked portions of the base 132 not underlying the parallel features 130 (FIG. 4) and to transfer the dimensions of the parallel features 130 into the unmasked portions of the base 132 underlying the parallel features 130 (e.g., to form the parallel features 130' of the template structure 154). In further embodiments, depending on the conditions (e.g., time, chemistries, etc.) of the etching process, the height $H_1$ of the parallel features 130 of the intermediate template structure 128 may be different than (e.g., larger than) the height $H_3$ of the parallel features 130' of the template structure 154. Remaining portions of the additional parallel spacers 148 and the additional template masking materials 134 may then be selectively removed relative to the template structure 154.

Figure 8A:
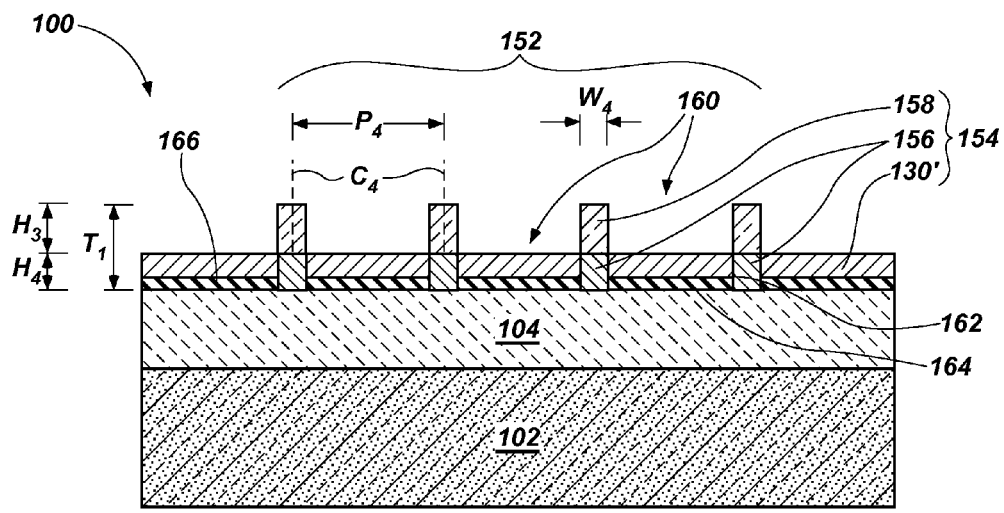
Figure 8B:
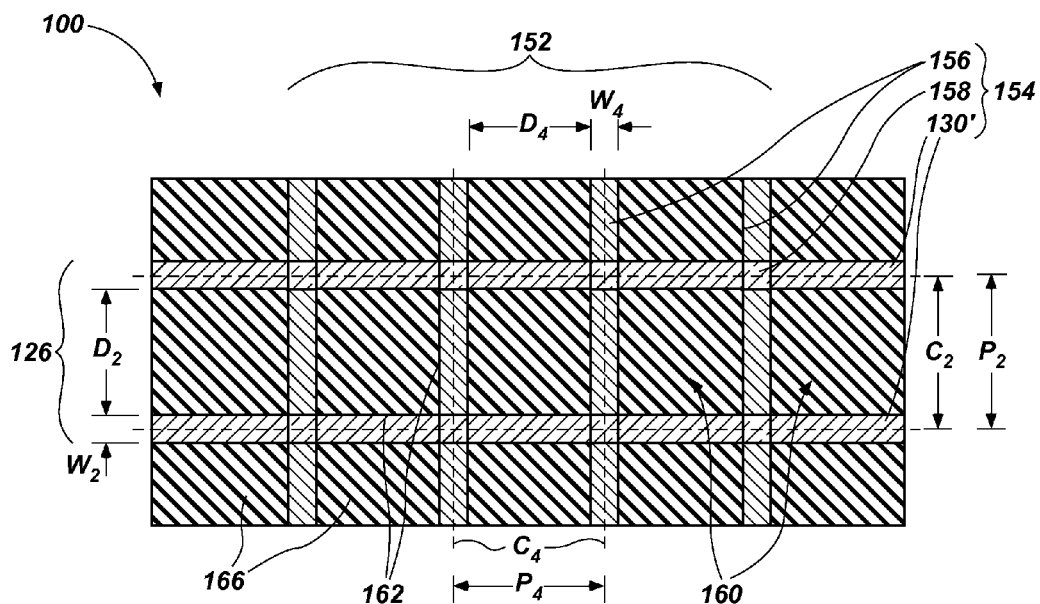

Referring to FIGS. 8A and 8B, a neutral wetting material 166 may be formed over the substrate masking material 104 defining the floor 164 of each of the wells 160. The neutral wetting material 166 may be a material that has exhibits equal affinity for different polymer blocks (and any corresponding homopolymers, if present) of a block copolymer material to be deposited in the wells 160. Thus, the neutral wetting material 166 may not be preferential (e.g., selective) to any polymer block (or homopolymer, if present) of a block copolymer material. The neutral wetting material 166 may, for example, be a neutral wetting carbon material, or a neutral wetting polymer. As a non-limiting example, if the block copolymer material to be deposited in the wells 160 is PS-b-PMMA, the neutral wetting material 166 may be a random PS:PMMA copolymer material (P(S-r-MMA)), a benzocyclobutene (BCP)- or azidomethylstyrene (AMS)-functionalized random copolymer of styrene and methyl methacrylate (e.g., P(S-r-MMA-r-BCP)), a hydroxyl functionalized random copolymer of styrene and methyl methacrylate (e.g., a 2-hydroxyethyl methacrylate (HEMA) functionalized random copolymer of styrene and methyl methacrylate (P(S-r-MMA-r-HEMA))), or a neutral wetting carbon material. In some embodiments, the neutral wetting material 166 is a neutral wetting carbon material. The neutral wetting material 166 may partially fill each of the wells 160. The neutral wetting material 166 may be formed at any suitable thickness facilitating the formation of the self-assembled block copolymer material, such as a thickness within a range of from about 5 nm to about 10 nm.

The neutral wetting material 166 may be formed using conventional processes (e.g., a PVD process, a CVD process, an ALD process, or a spin-coating process), which are not described in detail herein. By way of non-limiting example, if the neutral wetting material 166 is a neutral wetting carbon material, the neutral wetting carbon material may be deposited in the wells 160 by a CVD process. As another non-limiting example, if the neutral wetting material 166 is a neutral wetting random copolymer material, the neutral wetting random copolymer material may be spin-coated into the wells 160 and cross-linked (e.g., by way of at least one of thermal-processing and photo-processing). After forming the neutral wetting material 166 on the floor 164 of the wells 160, portions of the neutral wetting material 166 present on surfaces of the template structure 154 (e.g., surfaces of the parallel features 130', the additional parallel features 156, and the elevated pillars 158 not proximate the substrate masking material 104) may be removed.

In additional embodiments, the neutral wetting material 166 may be formed on the substrate masking material 104 prior to forming the template structure 154. For example, the neutral wetting material 166 may be formed between the substrate masking material 104 and the template material 106 (FIG. 1), and then the template structure 154 may be formed as previously described with reference to FIGS. 1 through 7B (i.e., such that the template structure 154 is formed over the neutral wetting material 166, and such that the neutral wetting material 166 defines the floor 164 of each of the wells 160).

Figure 9A:
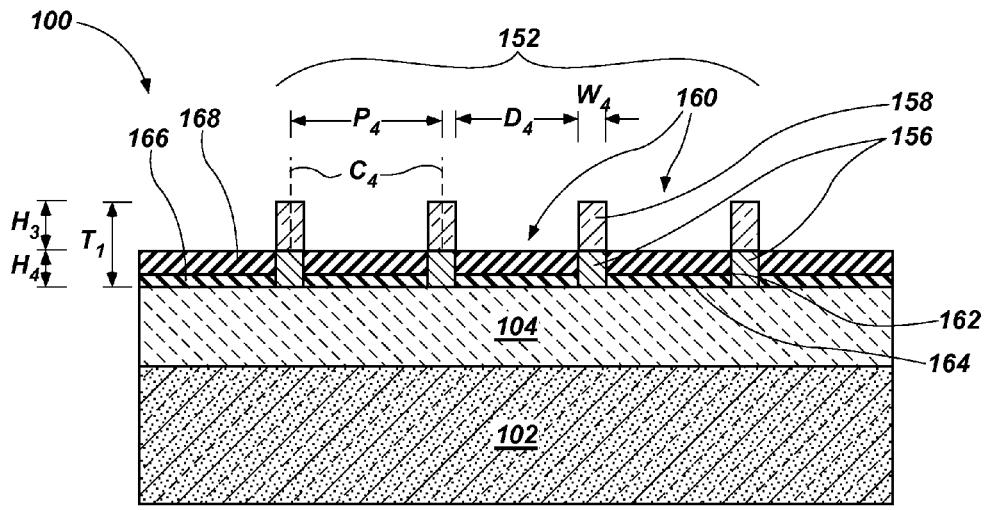
Figure 9B:
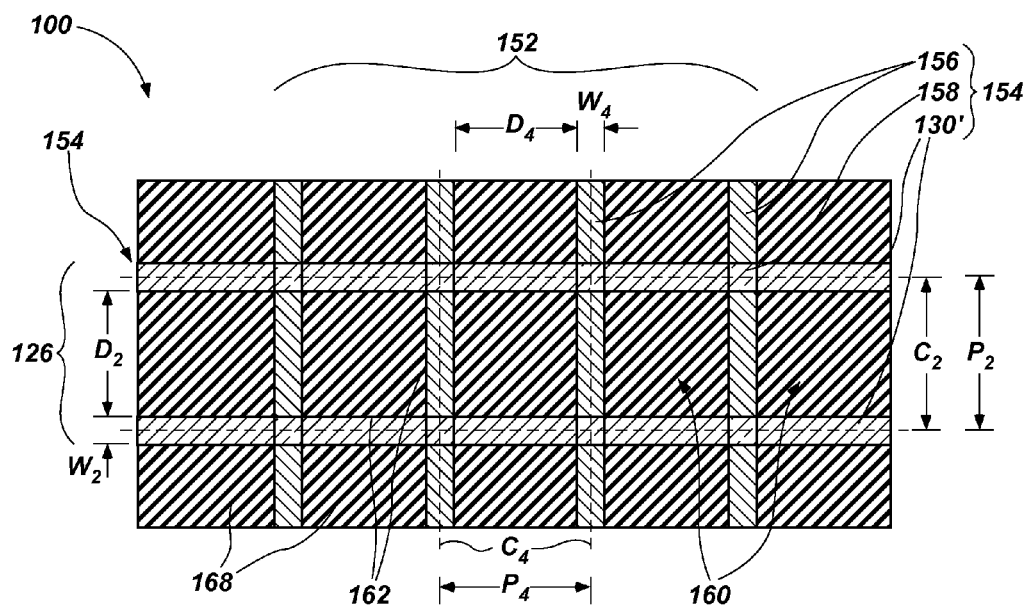

Referring next to FIGS. 9A and 9B, a block copolymer material 168 may be formed (e.g., deposited) in each of the wells 160. As used herein, the term "block copolymer material" means and includes a material including at least one block copolymer. In turn, as used herein, the term "block copolymer" means and includes a polymer including two or more polymer blocks covalently bound to one or more polymer blocks of unlike type. The block copolymer material may also include at least one homopolymer of the same polymer type as a polymer block of the block copolymer included therein. As used herein, the term "homopolymer" means and include a polymer including a single type of repeat unit (e.g., a single repeating monomer). For example, the block copolymer material 168 may be a self-assembling (SA) block copolymer (e.g., an SA diblock copolymer, an SA triblock copolymer, etc.), or may be a blend of an SA block copolymer and at least one homopolymer of the same polymer type as a polymer block of the SA block copolymer. Suitable SA block copolymers may include, but are not limited to, PS-b-PMMA, PS-b-PDMS, polystyrene-block-polyvinylpyridine (PS-b-PVP), polystyrene-block-polyisoprene (PS-b-PI), polystyrene-block-polybutadiene (PS-b-PB), polystyrene-block-polylactide (PS-b-PA), polyethyleneoxide-block-polyisoprene (PEO-b-PI), polyethyleneoxide-block-polybutadiene (PEO-b-PB), polyethyleneoxide-block-polymethylmethacrylate (PEO-b-PMMA), polyethyleneoxide-block-polystyrene (PEO-b-PS), polybutadiene-block-polyvinylpyridine (PB-b-PVP), polyisoprene-block-polymethylmethacrylate (PI-b-PMMA). In some embodiments, the block copolymer material 168 is PS-b-PMMA. In additional embodiments, the block copolymer material 168 is PS-b-PDMS.

The block copolymer material 168 may have an SA block copolymer chain length and volumetric ratio of constituent polymers (i.e., polymer blocks of the SA block copolymer, and, if present, any homopolymers) facilitating the formation of a rectangular (e.g., square) array of cylindrical domains of a first polymer within a matrix domain of a second polymer in each of the wells 160, as described in further detail below. For example, if the block copolymer material 168 is an SA diblock copolymer, a first polymer block to be self-assembled into the cylindrical domains may constitute from about 20 percent to about 40 percent of the total volume of the SA diblock copolymer, and a second polymer block to be self-assembled into the matrix domain may constitute a remaining percentage of the total volume of the SA diblock copolymer (e.g., from about 80 percent to about 60 percent of the total volume of the SA diblock copolymer). If the block copolymer material 168 is a blend of an SA block copolymer and at least one homopolymer, the at least one homopolymer may constitute from about 0.1 percent to about 40 percent of the total volume of the blend. In some embodiments, the block copolymer material 168 is a PS-b-PMMA copolymer including about 30 percent by volume PS and about 70 percent by volume PMMA. In additional embodiments, the block copolymer material 168 is a PS-b-PDMS diblock copolymer including about 30 percent by volume PS and about 70 percent by volume PDMS.

The block copolymer material 168 may substantially fill a remaining portion of each of the wells 160 (i.e., a portion of each of the wells 160 remaining after the formation of the neutral wetting material 166 therein). The sidewalls 162 of the wells 160 may be preferential wetting to one of the polymer blocks of the block copolymer material 168. In addition, the block copolymer material 168 may be substantially contained within the wells 160 (i.e., less than or equal to a monolayer of the block copolymer material 168 may be located outside of the wells 160, such as on the surfaces of the parallel features 130', the additional parallel features 156, and the elevated pillars 158 outside of the wells 160). In some embodiments, the block copolymer material 168 has a thickness within a range of about 25 nm to about 30 nm and is substantially contained in the wells 160.

The block copolymer material 168 may be formed in each of the wells 160 using conventional processes (e.g., spin-coating, knife-coating, etc.), which are not described in detail herein. By way of non-limiting example, the block copolymer material 168 may be deposited into each of the wells 160 by spin-coating from a dilute solution of the block copolymer material 168 in an organic solvent (e.g., dichloroethane, toluene, etc.). The deposition process may be controlled so that capillary forces pull excess of the block copolymer material 168 (e.g., block copolymer material 168 deposited outside of the wells 160) greater than a monolayer into the wells 160.

Figure 10A:
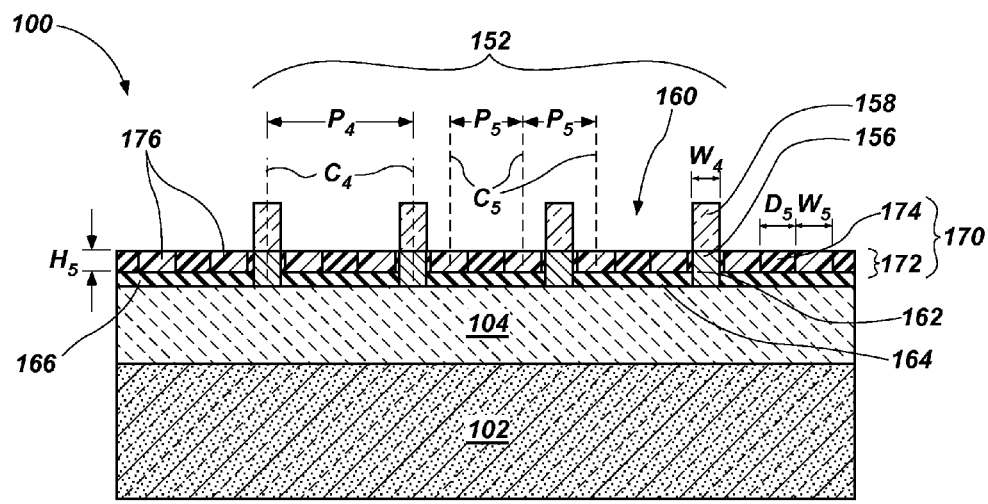
Figure 10B:
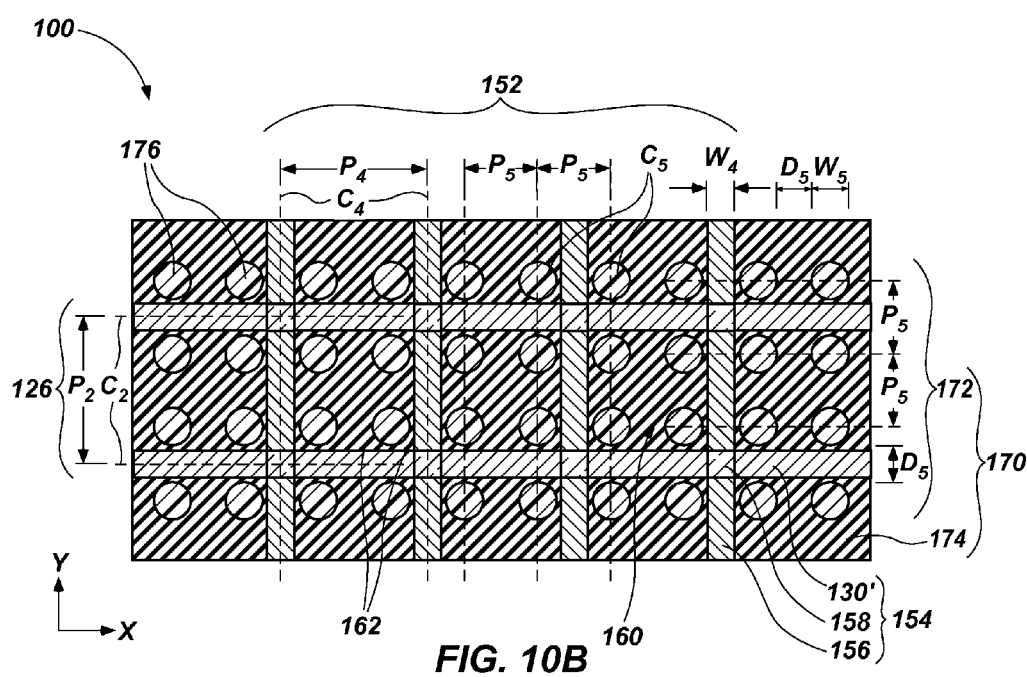

Referring to FIGS. 10A and 10B, the block copolymer material 168 (FIGS. 9A and 9B) may be processed (e.g., annealed) to form a self-assembled block copolymer material 170 including a rectilinear array 172 of cylindrical domains 176 of a first polymer within a matrix domain 174 of a second polymer. The first polymer may correspond to a minority polymer of the block copolymer material 168 (e.g., a polymer, including a polymer block of an SA block copolymer and any corresponding homopolymer, present in a relatively lower amount), and the second polymer may correspond to a majority polymer of the block copolymer material 168 (e.g., another polymer, including another polymer block of an SA block copolymer and any corresponding homopolymer, present in a relatively greater amount). The sidewalls 162 of the wells 160 may be preferential wetting to the majority polymer of the block copolymer material 168. For example, if the block copolymer material 168 is an SA block copolymer (e.g., an SA diblock copolymer), the first polymer may correspond to a minority polymer block of the SA block copolymer and the second polymer may correspond to a majority polymer block of the SA block copolymer. In some embodiments, the cylindrical domains 176 are formed of and include PS, and the matrix domain 174 is formed of and includes PMMA. In additional embodiments, the cylindrical domains 176 are formed of and include PS, and the matrix domain 174 is formed of and includes PDMS.

As shown in FIG. 10B, the rectilinear array of cylindrical domains 172 may include rows of cylindrical domains 176 of the first polymer extending in an X direction and columns of the cylindrical domains 176 of the first polymer extending in a Y direction. The X direction may be substantially perpendicular to the Y direction. Each of the cylindrical domains 176 of the first polymer may have substantially the same width $W_5$ (i.e., diameter) and height $H_5$, and may be oriented perpendicular (i.e., surface normal) to the substrate 102. In addition, within each row and each column, the cylindrical domains 176 of the first polymer may be substantially aligned and regularly spaced by a distance $D_5$. A pitch $P_5$ between centers $C_5$ of adjacent cylindrical domains (e.g., adjacent cylindrical domains of a particular row or a particular column) of the rectilinear array of cylindrical domains 172 may be substantially uniform throughout the self-assembled block copolymer material 170.

By way of non-limiting example, the width $W_5$ of each of the cylindrical domains 176 of the first polymer may be equal to about one-fourth (¼) of the pitch (e.g., the pitch $P_2$, and the pitch $P_4$) between centerlines (e.g., the centerlines $C_2$, and the centerlines $C_4$) of adjacent features (e.g., adjacent parallel features of the parallel features 130', and adjacent additional parallel features of the additional parallel features 156) of the template structure 154. In addition, the height $H_5$ of each of the cylindrical domains 176 of the first polymer may be equal to the height of the block copolymer material 168 (FIGS. 9A and 9B). Furthermore, the pitch $P_5$ between centers $C_5$ of adjacent cylindrical domains may be equal to about one-half (½) of the pitch (e.g., the pitch $P_2$/and the pitch $P_4$) between centerlines (e.g., the centerlines $C_2$, and the centerlines $P_4$) of adjacent parallel features (e.g., adjacent parallel features of the parallel features 130', and adjacent additional parallel features of the additional parallel features 156) of the template structure 154. In some embodiments, the width $W_5$ of each of the cylindrical domains 176 is about 15 nm, the height $H_5$ of the cylindrical domains 176 is within a range of from about 25 nm to about 30 nm, and the pitch $P_5$ between centers $C_5$ of adjacent cylindrical domains of the cylindrical domains 176 is about 30 nm.

As illustrated in FIG. 10B, the rectilinear array 172 of cylindrical domains 176 of the first polymer may be considered an aggregate of rectangular (e.g., square) arrays (not numbered) of the cylindrical domains 176 of the first polymer contained within the wells 160. Namely, within each of the wells 160, the dimensions and preferential wetting characteristics of the sidewalls 162 (i.e., as defined by parallel features 130' and additional parallel features 156 of the template structure 154) in combination with the characteristics of the neutral wetting material 166, facilitates the formation of a rectangular array of the cylindrical domains 176 of the first polymer within the matrix domain 174 of the second polymer. Each rectangular array includes four of the cylindrical domains 176 of the first polymer having the dimensions and spacing previously described (e.g., width $W_5$, height $H_5$, and pitch $P_5$) in rectangular (e.g., square) registration. In turn, the dimensions and spacing of each of the parallel features 130' and the additional parallel features 156 of the template structure 154 enables adjacent cylindrical domains 176 of adjacent rectangular arrays (i.e., in adjacent wells) to have the same alignment, dimensions, and spacing, resulting in the rectilinear array 172 of cylindrical domains 176.

The self-assembled block copolymer material 170 may be formed using a annealing process. For example, the block copolymer material 168 may be thermally annealed at a temperature above the glass transition temperature of the polymer blocks and homopolymers (if any) of the block copolymer material 168 to effectuate separation and self-assembly according to the wetting characteristics of the wells 160 (e.g., the preferential wetting characteristics of the sidewalls 162, and the neutral wetting characteristics of the neutral wetting material 166 on the floor 164). As another example, the block copolymer material 168 may be solvent annealed by swelling the polymer blocks and homopolymers (if any) of the block copolymer material 168 with a solvent and then evaporating the solvent. In some embodiments, such as where the block copolymer material 168 is a PS-b-PMMA copolymer, the block copolymer material 168 is annealed at a temperature within a range of from about 180° C. to about 250° C. in a vacuum oven or under an inert atmosphere for a period of time within a range of from about 2 minutes to about 24 hours to form the self-assembled block copolymer material 170.

Figure 11A:
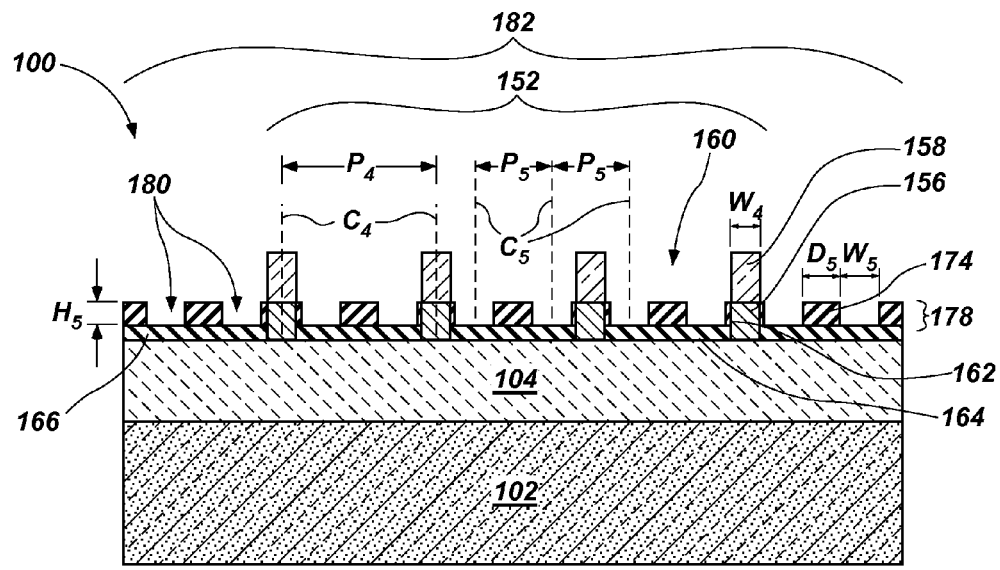
Figure 11B:
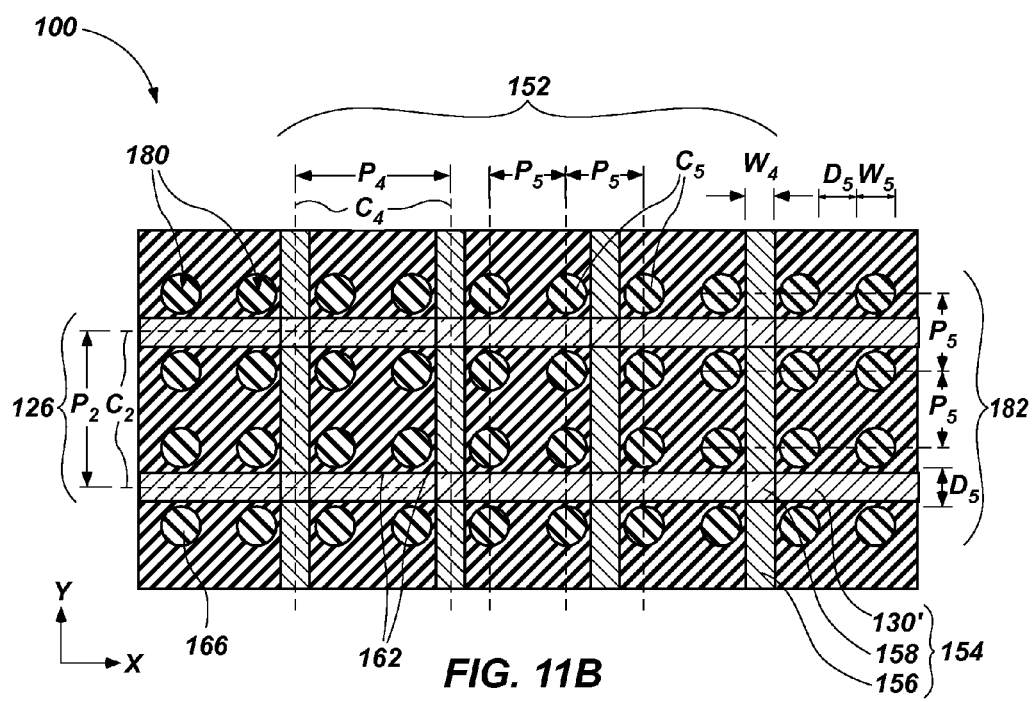

Referring next to FIGS. 11A and 11B, the cylindrical domains 176 (FIGS. 10A and 10B) of the first polymer may be selectively removed to form a patterned polymer material 178 including the matrix domain 174 of the second polymer surrounding cylindrical openings 180. The cylindrical openings 180 have substantially the same dimensions (e.g., width $W_5$, and height $H_5$), spacing (e.g., distance $D_5$, and pitch $P_5$), and alignment as the cylindrical domains 176 of the first polymer. The patterned polymer material 178 may thus define a rectilinear pattern 182 of cylindrical openings 180 (i.e., derived from and having substantially the same dimensions and spacing as the rectilinear array of cylindrical domains 172 of the first polymer) to be transferred to the substrate 102, as described in further detail below.

The selective removal of the cylindrical domains 176 of the first polymer to form the patterned polymer material 178 may be performed using conventional processes, which are not described in detail herein. By way of non-limiting example, the cylindrical domains 176 of the first polymer may be removed using at least one of an oxygen plasma process and a chemical dissolution process (e.g., a process including irradiating the cylindrical domains 176 of the first polymer, ultrasonicating the self-assembled block copolymer material 170 in acetic acid, ultrasonicating the self-assembled block copolymer material 170 in deionized water, and rinsing the self-assembled block copolymer material 170 to remove the cylindrical domains 176 of the first polymer).

Figure 12A:
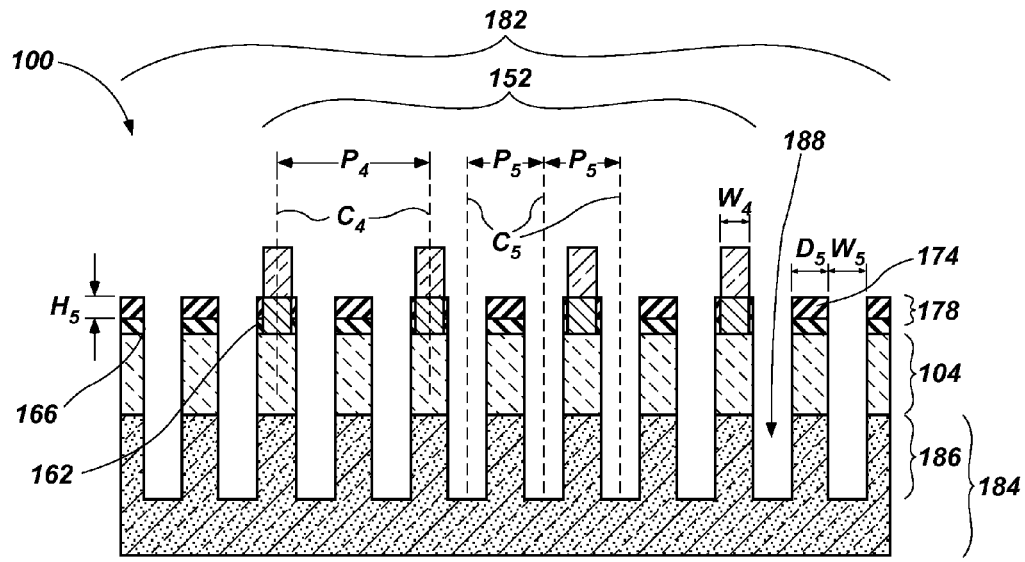
Figure 12B:
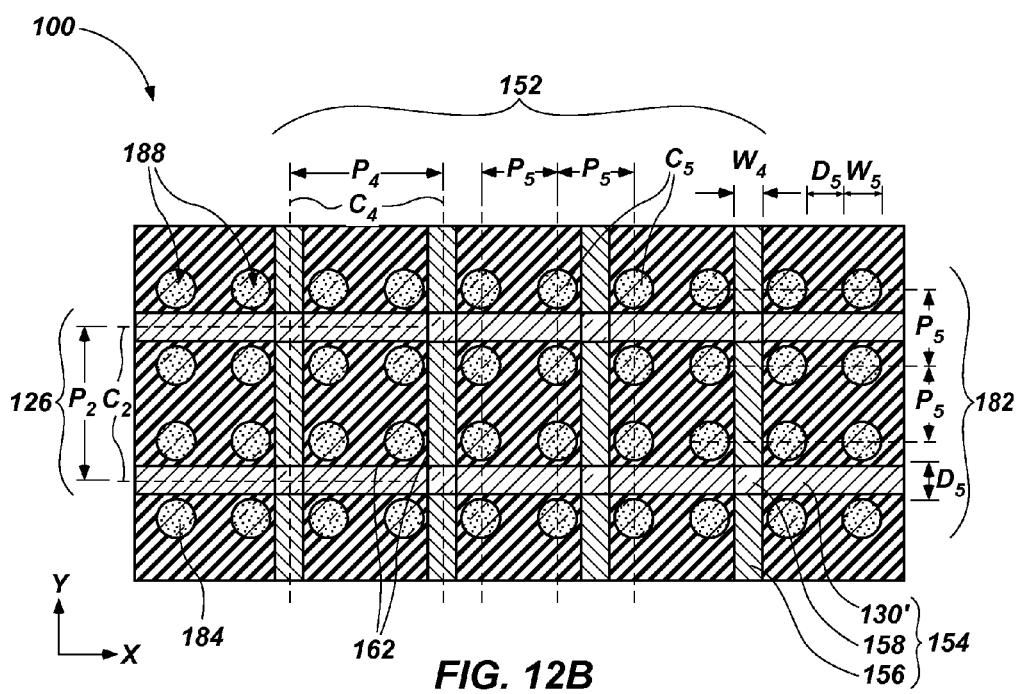

Referring next to FIGS. 12A and 12B, the rectilinear pattern 182 of cylindrical openings 180 defined by the patterned polymer material 178 may be transferred or extended into the substrate 102 (FIGS. 11A and 11B) to form a patterned substrate 184 including a rectilinear array 186 of openings 188. The rectilinear array 186 may include rows of openings 188 extending in the X direction and columns of the openings 188 extending in the Y direction. The openings 188 may extend partially into the patterned substrate 184, or may extend completely through the patterned substrate 184. The openings 188 may have substantially the same width $W_5$ as the cylindrical openings 180 of the patterned polymer material 178 (i.e., the same width $W_5$ as the cylindrical domains 176 of the self-assembled block copolymer material 170). In addition, within each row and each column, the openings 188 may be substantially aligned and may have the same pitch $P_5$ as the cylindrical openings 180 of the patterned polymer material 178 (i.e., the same pitch $P_5$ as the cylindrical domains 176 of the self-assembled block copolymer material 170). In some embodiments, each of the openings 188 extends partially into the patterned substrate 184, the width $W_5$ of each of the openings 188 is about 15 nm, and the pitch $P_5$ between adjacent openings 188 is about 30 nm.

To form the patterned substrate 184, the matrix domain 174 of the patterned polymer material 178 may be used as a mask for at least one etching process (e.g., an anisotropic etching process, such as an reactive ion etching process) to substantially remove unmasked portions (e.g., portions not underlying the matrix domain 174) of each of the substrate masking material 104 and the substrate 102. The unmasked portions of the substrate masking material 104 may be completely removed, and the unmasked portions of the substrate 102 may be at least partially removed (i.e., may be partially removed, or may be completely removed). The etching process may, for example, extend the rectilinear pattern 182 of openings 180 partially through the substrate 102 to form the rectilinear array 186 of openings 188 of the patterned substrate 184.

Accordingly, a method of forming a rectilinear array of openings in a substrate may comprise forming a template structure comprising a plurality of parallel features and a plurality of additional parallel features perpendicularly intersecting the plurality of additional parallel features of the plurality over a substrate to define wells, each of the plurality of parallel features having substantially the same dimensions and relative spacing as each of the plurality of additional parallel features. A block copolymer material may be formed in each of the wells. The block copolymer material may be processed to form a patterned polymer material defining a pattern of openings. The pattern of openings may be transferred to the substrate to form an array of openings in the substrate.

In addition, a method of forming a semiconductor device structure may comprise forming a template structure comprising intersecting features defining substantially rectangular wells over a substrate, each of the intersecting features having substantially the same dimensions and being preferential wetting to a polymer block of a self-assembling block copolymer. A neutral wetting material may be formed over a floor of each of the substantially rectangular wells. A block copolymer material comprising the self-assembling block copolymer may be formed over the neutral wetting material. The block copolymer material may be self-assembled to form an array of cylindrical domains of a first polymer within a matrix domain of a second polymer, the array of cylindrical domains of the first polymer exhibiting uniform pitch between substantially all adjacent cylindrical domains of the first polymer. The cylindrical domains of the first polymer may be selectively removed to define a pattern of cylindrical openings in the matrix domain of the second polymer. The pattern of cylindrical openings may be transferred to the substrate.

Figure 13A:
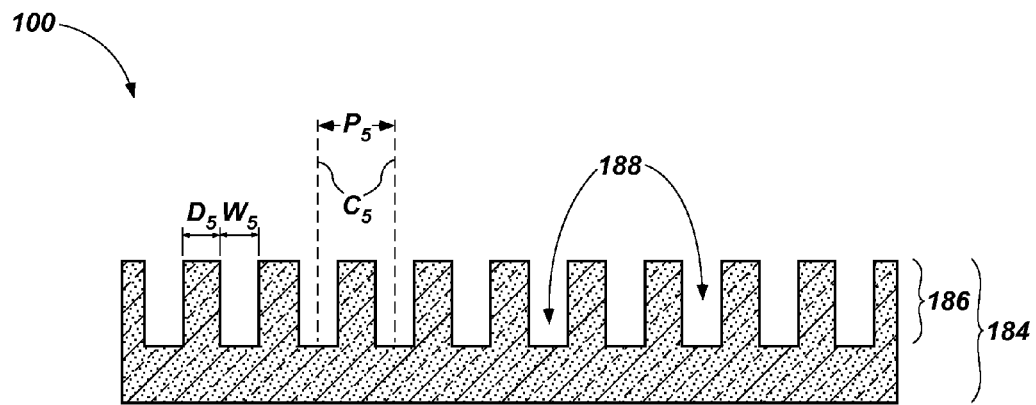
Figure 13B:
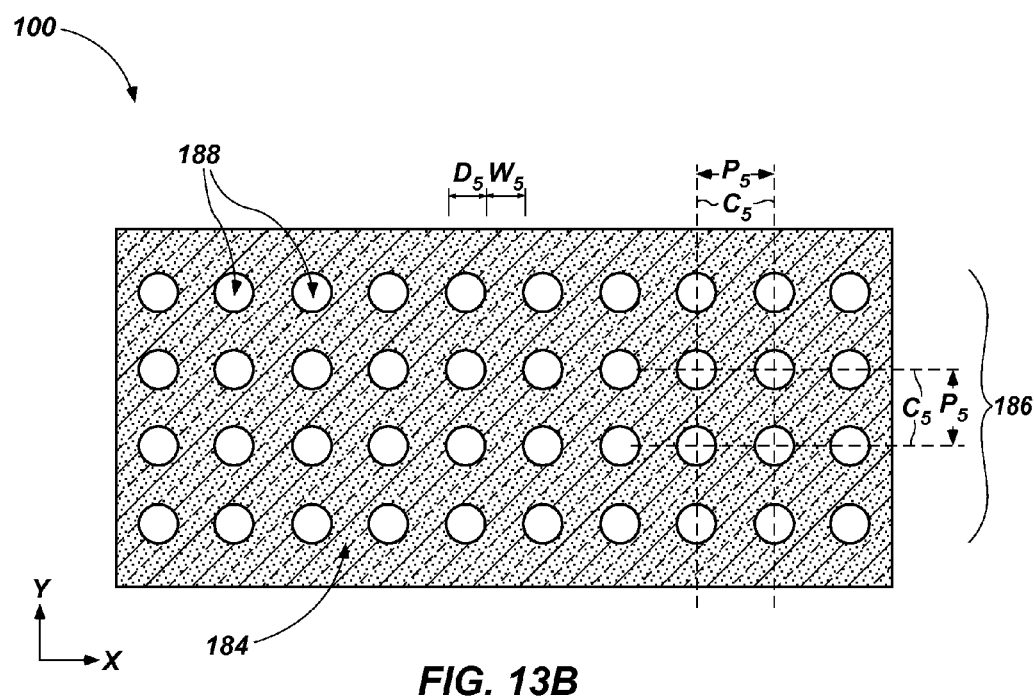

Following the formation of the patterned substrate 184, remaining portions of the template structure 154 (e.g., the parallel features 130', the additional parallel features 156, and the elevated pillars 158), patterned polymer material 178 (e.g., the matrix domain 174), and the substrate masking material 104 may be removed, as depicted in FIGS. 13A and 13B. These materials may be removed using conventional processes, such as conventional etching processes, which are not described in detail herein. The semiconductor device structure 100 including the patterned substrate 184 may then be subjected to additional processing, as desired. For example, the openings 188 in the substrate 102 may be at least partially filled with a material, such as a conductive material, to form contacts (e.g., bond pads). By utilizing the methods of the disclosure, the contacts may be closely packed and may have a uniform pitch between adjacent contacts.

Accordingly, a semiconductor device structure of the disclosure may comprise a substrate defining a rectilinear array of openings, each opening of the rectilinear array of openings having substantially the same width of less than or equal to about 25 nm, and adjacent openings of the rectilinear array of openings having substantially the same pitch of less than or equal to about 50 nm.

The methods of the disclosure provide an effective and reliable way to control the dimensions and spacing of the rectilinear array of openings 186 of the patterned substrate 184. The methods facilitate simple and cost-effective formation of very small openings 188 (e.g., critical dimensions of less than or equal to about 30 nm) that are closely packed (e.g., a pitch of less than or equal to about 50 nm) and are substantially aligned in multiple directions (e.g., in the X and Y directions). The methods of the disclosure advantageously facilitate improved device performance, lower cost, increased miniaturization of components, and greater packaging density as compared to conventional methods of forming a contact array for a semiconductor device structure (e.g., a DRAM device structure).

While the disclosure is susceptible to various modifications and alternative forms, specific embodiments have been shown by way of example in the drawings and have been described in detail herein. However, the disclosure is not intended to be limited to the particular forms disclosed. Rather, the disclosure is to cover all modifications, equivalents, and alternatives falling within the scope of the disclosure as defined by the following appended claims and their legal equivalents.

What is claimed is:

1. A method of forming an array of openings in a substrate, comprising:
   forming a template structure comprising a plurality of parallel features and a plurality of additional parallel features perpendicularly intersecting the plurality of additional parallel features over a substrate to define wells, each of the plurality of parallel features having substantially the same dimensions and relative spacing as each of the plurality of additional parallel features;
   forming a block copolymer material in the wells;
   processing the block copolymer material to form a patterned polymer material defining a pattern of openings; and
   transferring the pattern of openings to the substrate to form an array of openings in the substrate.

2. The method of claim 1, wherein forming the template structure comprising a plurality of parallel features and a plurality of additional parallel features comprises forming each of the parallel features and each of the additional parallel features to have substantially the same width within a range of from about 20 percent to about 40 percent of a target pitch between adjacent openings of the array of openings.

3. The method of claim 1, wherein forming the template structure comprising a plurality of parallel features and a plurality of additional parallel features comprises:
   forming the plurality of parallel features to exhibit a substantially uniform pitch between adjacent parallel features, the substantially uniform pitch equal to about two times a target pitch between adjacent openings of the array of openings; and
   forming the plurality of the additional parallel features to exhibit another substantially uniform pitch between adjacent additional parallel features, the another substantially uniform pitch substantially the same as the substantially uniform pitch exhibited by the plurality of parallel features.

4. The method of claim 1, wherein forming the template structure comprising a plurality of parallel features and a plurality of additional parallel features comprises forming each of the parallel features and the additional parallel features to have substantially the same height within a range of from about one-half to about three times a target pitch between adjacent openings of the array of openings.

5. The method of claim 1, wherein forming the template structure comprising a plurality of parallel features and a plurality of additional parallel features comprises:
   forming parallel spacers over a template material, each of the parallel spacers having substantially the same dimensions and spacing;
   transferring a first pattern defined by the parallel spacers to the template material to form an intermediate template structure comprising initial parallel features protruding from a base;
   forming additional parallel spacers over the intermediate template structure, the additional parallel spacers oriented in a direction substantially perpendicular to the parallel spacers and having substantially the same dimensions and spacing as the parallel spacers; and
   transferring a second pattern defined by the additional parallel spacers to the intermediate template structure to form the template structure.

6. The method of claim 5, wherein forming parallel spacers over the template material comprises:
   forming parallel photoresist lines exhibiting a first substantially uniform pitch between adjacent parallel photoresist lines, each of the parallel photoresist lines having substantially the same width and height;
   forming a spacer material over the parallel photoresist lines; and
   removing a portion of the spacer material to form the parallel spacers on sidewalls of the parallel photoresist lines, the parallel spacers exhibiting a second substantially uniform pitch between adjacent parallel spacers, the second substantially uniform pitch equal to about one-half the first substantially uniform pitch.

7. The method of claim 6, wherein forming additional parallel spacers over the intermediate template structure comprises:
   removing materials remaining over the intermediate template structure after the formation thereof;
   forming additional parallel photoresist lines over the intermediate template structure after removing materials remaining over the intermediate template structure, the additional parallel photoresist lines oriented in a direction substantially perpendicular to the parallel photoresist lines and having substantially the same dimensions and spacing as the parallel photoresist lines;
   forming additional spacer material over the additional parallel photoresist lines; and
   removing a portion of the additional spacer material to form the additional parallel spacers on sidewalls of the additional parallel photoresist lines.

8. The method of claim 5, wherein transferring the first pattern defined by the parallel spacers to the template material to form the intermediate template structure comprises extending the first pattern partially into the template material.

9. The method of claim 1, wherein forming the template structure comprising the plurality of parallel features and the plurality of additional parallel features comprises forming the template structure from a template material preferential wetting to a polymer block of the block copolymer material.

10. The method of claim 1, further comprising forming a neutral wetting material over floors of the wells prior to forming the block copolymer material in the wells.

11. The method of claim 1, wherein forming the block copolymer material in the wells comprises formulating the block copolymer material to have a block copolymer chain length and volumetric ratio of constituent polymers facilitating the formation of a rectangular array of cylindrical domains of a first polymer within a matrix domain of a second polymer within the wells during the processing of the block copolymer material.

12. The method of claim 1, wherein forming the block copolymer material in the wells comprises depositing a self-assembling diblock copolymer comprising:
   a first polymer block comprising from about 20 percent to about 40 percent of a total volume of the self-assembling diblock copolymer; and
   a second polymer block comprising a remaining percentage of the total volume of the self-assembling diblock copolymer.

13. The method of claim 1, wherein processing the block copolymer material to form a patterned polymer material defining a pattern of openings comprises:
   annealing the block copolymer material to form a self-assembled block copolymer material comprising an array of cylindrical domains of a first polymer within a matrix domain of a second polymer; and
   selectively removing the cylindrical domains of the first polymer to form the patterned polymer material.

14. A method of forming a semiconductor device structure, comprising:
- forming a template structure comprising intersecting features defining substantially rectangular wells over a substrate, each of the intersecting features having substantially the same dimensions and being preferential wetting to a polymer block of a self-assembling block copolymer;
- forming a neutral wetting material over a floor of each of the substantially rectangular wells;
- forming a block copolymer material comprising the self-assembling block copolymer over the neutral wetting material;
- self-assembling the block copolymer material to form an array of cylindrical domains of a first polymer within a matrix domain of a second polymer, the array of cylindrical domains of the first polymer exhibiting uniform pitch between substantially all adjacent cylindrical domains of the first polymer;
- selectively removing the cylindrical domains of the first polymer to define a pattern of cylindrical openings in the matrix domain of the second polymer; and
- transferring the pattern of cylindrical openings to the substrate.

15. The method of claim 14, wherein forming the template structure comprising intersecting features defining substantially rectangular wells comprises forming the intersecting features to have the same width within a range of from about 6 nm to about 12 nm.

16. The method of claim 14, wherein forming the template structure comprising intersecting features defining substantially rectangular wells comprises forming the intersecting features to exhibit a substantially uniform pitch of less than or equal to about 60 nm between adjacent parallel features thereof.

17. The method of claim 14, wherein the self-assembling block copolymer comprises PS-b-PMMA or PS-b-PDMS.

18. The method of claim 14, wherein forming the block copolymer material comprising the self-assembling block copolymer over the neutral wetting material comprises depositing the block copolymer material to substantially fill a remaining space within each of the substantially rectangular wells.

19. The method of claim 14, wherein self-assembling the block copolymer material to form an array of cylindrical domains of a first polymer within a matrix domain of a second polymer comprises annealing the block copolymer material to form an array of four of the cylindrical domains of the first polymer within the matrix domain of the second polymer in each of the substantially rectangular wells.

20. The method of claim 14, wherein transferring the pattern of cylindrical openings to the substrate comprises etching the substrate using the matrix domain of the second polymer as an etch mask to form an array of openings in the substrate.

21. The method of claim 20, further comprising at least partially filling the array of openings with material.

* * * * *